(12) United States Patent
Kuo et al.

(10) Patent No.: US 9,876,153 B2
(45) Date of Patent: Jan. 23, 2018

(54) LIGHT-EMITTING DEVICE

(71) Applicant: EPISTAR CORPORATION, Hsinchu (TW)

(72) Inventors: Jai-Tai Kuo, Hsinchu (TW); Min-Hsun Hsieh, Hsinchu (TW); Lung-Kuan Lai, Hsinchu (TW); Wei-Kang Cheng, Hsinchu (TW); Chien-Liang Liu, Hsinchu (TW); Yih-Hua Renn, Hsinchu (TW); Shou-Lung Chen, Hsinchu (TW); Tsun-Kai Ko, Hsinchu (TW); Chi-Chih Pu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 64 days.

(21) Appl. No.: 14/757,460

(22) Filed: Dec. 23, 2015

(65) Prior Publication Data

US 2016/0190409 A1 Jun. 30, 2016

Related U.S. Application Data

(60) Provisional application No. 62/096,822, filed on Dec. 24, 2014.

(51) Int. Cl.
| | |
|---|---|
| *H01L 29/24* | (2006.01) |
| *H01L 33/62* | (2010.01) |
| *H01L 33/60* | (2010.01) |
| *H01L 33/50* | (2010.01) |
| *H01L 33/56* | (2010.01) |
| *H01L 33/46* | (2010.01) |

(52) U.S. Cl.
CPC ............ *H01L 33/62* (2013.01); *H01L 33/507* (2013.01); *H01L 33/56* (2013.01); *H01L 33/60* (2013.01); *H01L 33/46* (2013.01); *H01L 2224/18* (2013.01)

(58) Field of Classification Search
CPC ..... H01L 33/507; H01L 33/508; H01L 33/38; H01L 33/382; H01L 33/387; H01L 33/405; H01L 33/46; H01L 33/50; H01L 33/502; H01L 33/504; H01L 33/486; H01L 33/52; H01L 33/54; H01L 33/56; H01L 33/60
USPC ............................................ 257/98, 99, 100
See application file for complete search history.

(56) References Cited

U.S. PATENT DOCUMENTS

| | | |
|---|---|---|
| 7,992,516 B2 | 8/2011 | Shida et al. |
| 8,288,843 B2 | 10/2012 | Kojima et al. |
| 8,541,801 B2 | 9/2013 | Kim et al. |
| 8,999,736 B2 | 4/2015 | Hsieh et al. |
| 2004/0012958 A1* | 1/2004 | Hashimoto ............. H01L 33/38 362/241 |

(Continued)

FOREIGN PATENT DOCUMENTS

EP 2 768 035 A2 8/2014

*Primary Examiner* — Matthew E Warren
(74) *Attorney, Agent, or Firm* — Muncy, Geissler, Olds & Lowe, P.C.

(57) ABSTRACT

This disclosure discloses a light-emitting device. The light-emitting device includes a light-emitting diode, a metal bump, and a reflective insulation layer. The light-emitting diode includes an active layer, an insulation layer formed on the active layer and having a side surface, and a pad electrically connected to the active layer. The metal bump is formed on the pad. The reflective insulation layer covers the side surface.

18 Claims, 30 Drawing Sheets

(56) References Cited

U.S. PATENT DOCUMENTS

| | | | |
|---|---|---|---|
| 2008/0179611 A1* | 7/2008 | Chitnis | H01L 33/508 257/98 |
| 2008/0230796 A1* | 9/2008 | Ho | H01L 33/56 257/98 |
| 2009/0279279 A1 | 11/2009 | Hsueh | |
| 2010/0264438 A1* | 10/2010 | Suenaga | H01L 33/58 257/98 |
| 2011/0297985 A1* | 12/2011 | Naka | H01L 33/507 257/98 |
| 2012/0074441 A1 | 3/2012 | Seo et al. | |
| 2012/0112220 A1* | 5/2012 | West | H01L 33/46 257/98 |
| 2014/0042481 A1* | 2/2014 | Inoue | H01L 33/46 257/98 |
| 2014/0227813 A1* | 8/2014 | Yoneda | H01L 33/0095 438/33 |
| 2015/0200335 A1 | 7/2015 | Bhat et al. | |
| 2015/0200336 A1 | 7/2015 | Bhat et al. | |

* cited by examiner

LIGHT-EMITTING DEVICE

REFERENCE TO RELATED APPLICATION

This application claims the benefit of U.S. Provisional Application Ser. No. 62/096,822, filed on Dec. 24, 2014, the entire content of which is hereby incorporated by reference.

BACKGROUND

Technical Field

The present disclosure relates to a light-emitting device with a metal bump.

Description of the Related Art

The light-emitting diodes (LEDs) of the solid-state lighting elements have the characteristics of low power consumption, long operational life, small volume, quick response and good opto-electrical property like light emission with a stable wavelength so the LEDs have been widely used in various applications, for example, household appliances, indicator light of instruments, backlight module or flash for a camera phone.

In the aforesaid applications, there may require different optical features such as light intensity, light pattern, or color temperature. For example, the luminous flux is an index in household appliances. On the other hand, the illuminance is more important in a flash application. Accordingly, there is a need to have various light-emitting devices for these applications.

SUMMARY OF THE DISCLOSURE

The present disclosure provides a light-emitting device. This disclosure discloses a light-emitting device. The light-emitting device includes a light-emitting diode, a metal bump, and a reflective insulation layer. The light-emitting diode includes an active layer, an insulation layer formed on the active layer and having a side surface, and a pad electrically connected to the active layer. The metal bump is formed on the pad. The reflective insulation layer covers the side surface.

BRIEF DESCRIPTION OF THE DRAWING

The accompanying drawings are included to provide easy understanding of the application, and are incorporated herein and constitutes a part of this specification. The drawings illustrate the embodiments of the application and, together with the description, serves to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawings.

Figure 1A:
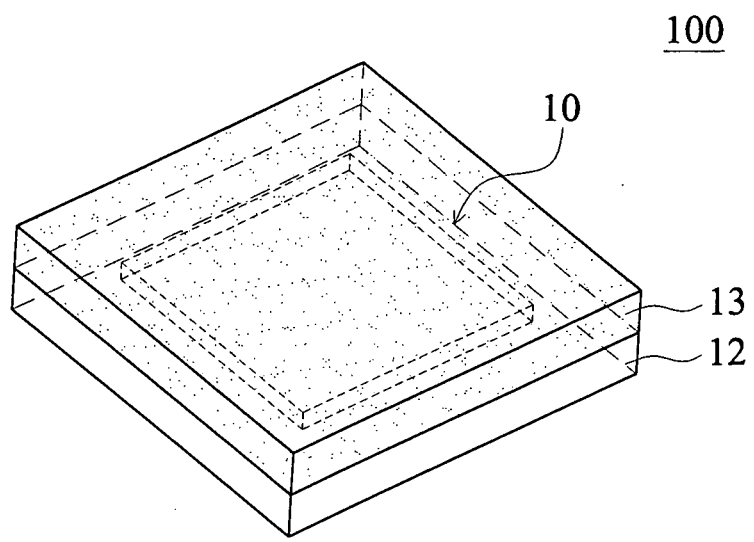
FIG. 1A is a perspective view of a light-emitting device in accordance with an embodiment of the present disclosure.
Figure 1B:
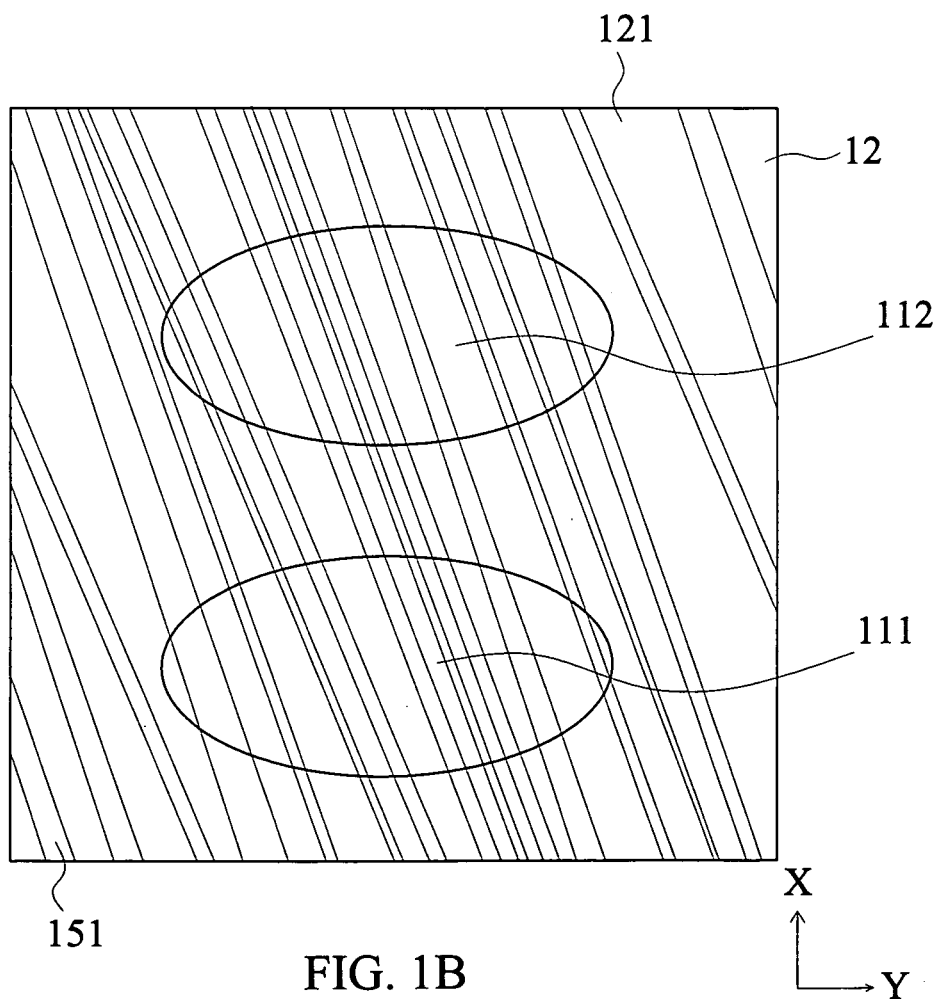
FIG. 1B is a bottom view of the light-emitting device shown in FIG. 1A.
Figure 1C:
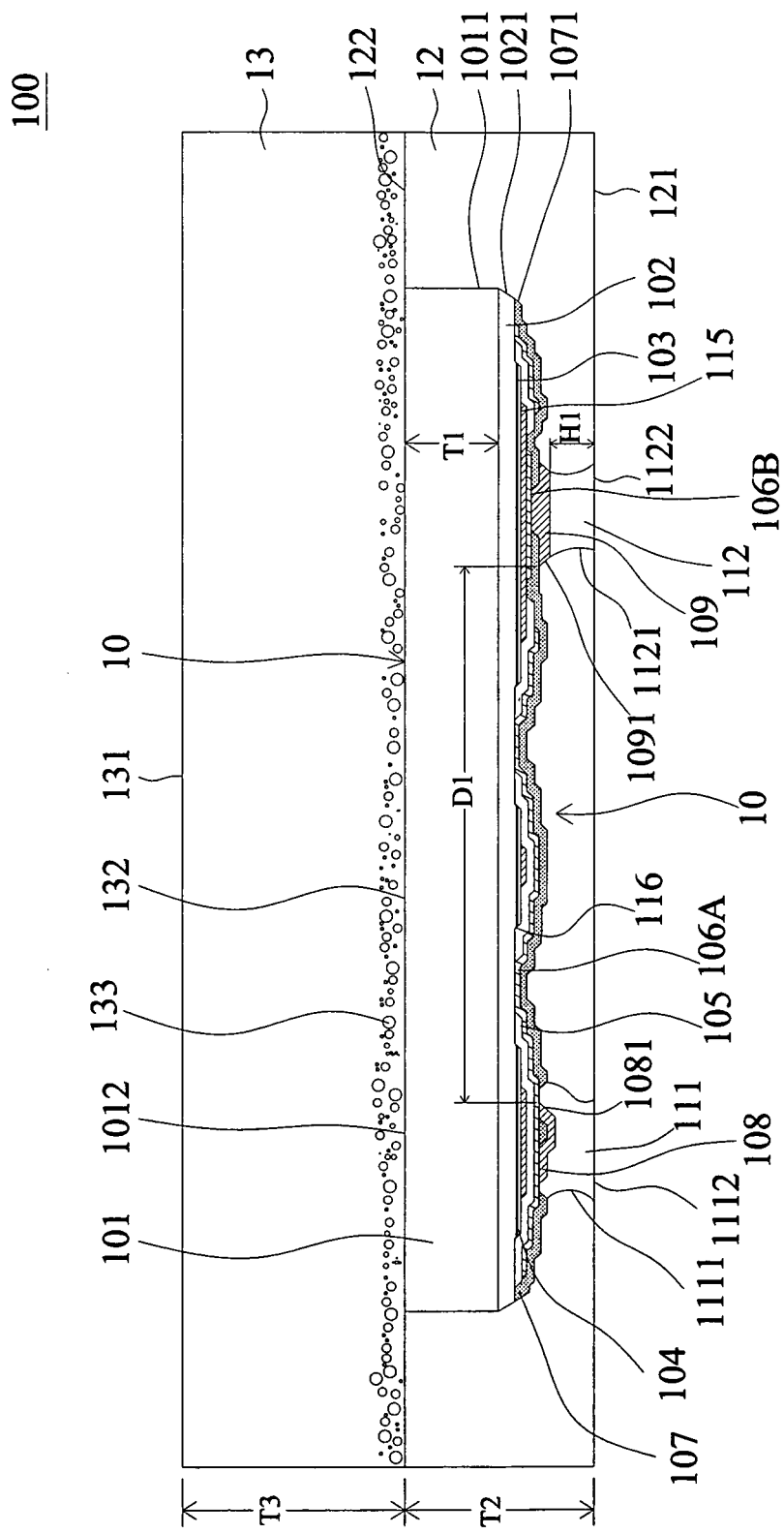
FIG. 1C is a cross-sectional view of the light-emitting device shown in FIG. 1A.
Figure 1D:
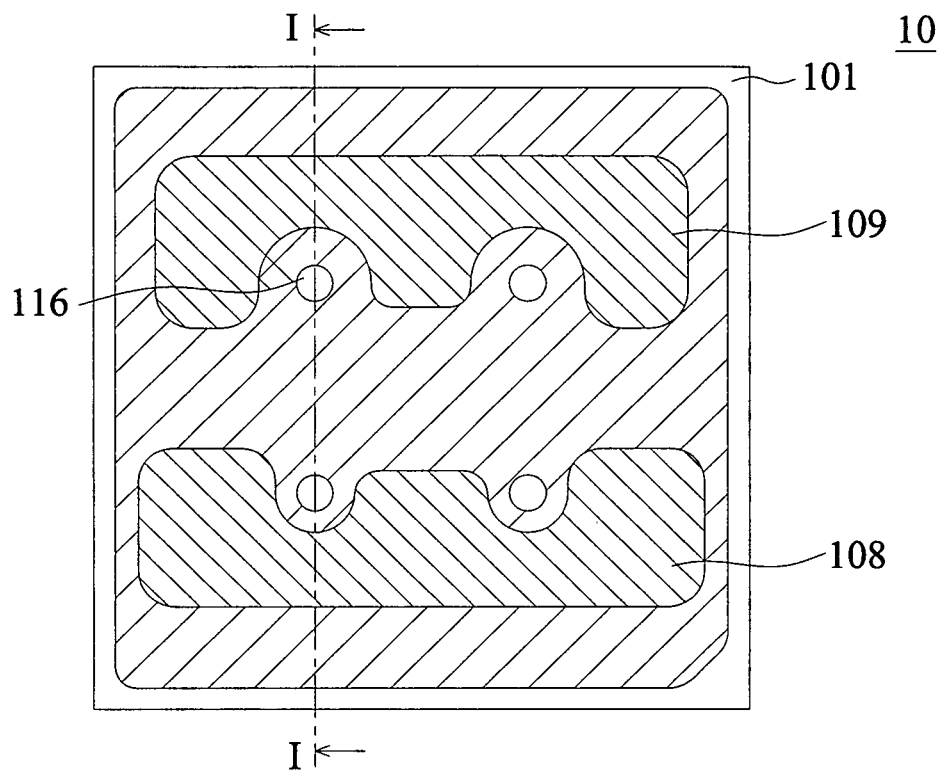
FIG. 1D is a bottom view of a light-emitting diode embodied in the light-emitting device shown in FIG. 1A.

FIG. 1A is a perspective view of a light-emitting device 100 in accordance with an embodiment of the present disclosure. FIG. 1B is a bottom view of the light-emitting device 100 shown in FIG. 1A. FIG. 1C is a cross-sectional view FIG. 1A. FIG. 1D is a bottom view of a light-emitting diode 10. The light-emitting diode 10 shown in FIG. 1C is a view taken along line I-I of FIG. 1D. For clearly illustrative, only some layers are shown in FIG. 1D, and each layer is drawn in a solid line regardless of an opaque, transparent, or translucent material.

Referring to FIGS. 1A, 1B, 1C and 1D, the light-emitting device 100 includes a light-emitting diode 10, first and second metal bumps 111, 112, a reflective insulation layer 12, and a wavelength conversion layer 13. The light-emitting diode 10 includes a substrate 101, a first-type semiconductor layer 102, an active layer 103, a second-type semiconductor layer 104, a first insulation layer 105, an electrical connection layer 106 (106A, 106B), a second insulation layer 107, a first pad 108, and a second pad 109.

Referring to FIGS. 1C and 1D, the light-emitting diode 10 further includes a plurality of trenches 116 formed to expose the first-type semiconductor layer 102. A current spreading layer 115 is optionally formed on and electrically connected to the second-type semiconductor layer 104. The first insulation layer 105 is formed in the trenches 116 to cover portions of the first-type semiconductor layer 102. The electrical connection layer 106A is formed on the first insulation layer 105 and the first-type semiconductor layer 102 uncovered by the first insulation layer 105. The second insulation layer 107 is formed to cover portions of the electrical connection layer 106A. The first pad 108 is formed on the electrical connection layer 106A uncovered by the second insulation layer 107 for electrically connecting to the first-type semiconductor layer 102 therethrough. The first pad 108 can be formed to not fully cover the electrical connection layer 106A which is exposed from the second insulation layer 107 to expose portions of the electrical connection layer 106A. The first metal bump 111 is formed to directly contact the first pad 108 and the electrical connection layer 106A exposed from the first pad 108. The first pad 108 is electrically isolated to the second-type semiconductor layer 104 by the first insulation layer 105.

Moreover, the electrical connection layer 106B is formed on the current spreading layer 115. The second insulation layer 107 is further formed to cover portions of the electrical connection layer 106B. The second pad 109 is formed on the second insulation layer 107 and the electrical connection layer 106B uncovered by the second insulation layer 107 for electrically connecting to the second-type semiconductor layer 104. The second metal bump 112 is formed to directly contact the second pad 109. In operation, provided the first-type semiconductor layer 102 is a n-type semiconductor layer and the second-type semiconductor layer 104 is a p-type semiconductor layer, when the light-emitting device 100 is electrically connected to an external power source, current can flow through the second metal bump 112, the second pad 109, the electrical connection layer 106B, the current spreading layer 115, the second-type semiconductor layer 104, the active layer 103, the first-type semiconductor layer 102, the electrical connection layer 106A, the first pad 108 and the first metal bump 111 such that the light-emitting device 100 can emit light.

In FIG. 1C, the reflective insulation layer 12 is formed to surround the light-emitting diode 10 and the metal bumps 111, 112. Specifically, the side surfaces 1011, 1021, 1071, 1091 of the substrate 101, the first-type semiconductor layer 102, the second insulation layer 107 and the second pad 109 are directly covered by the reflective insulation layer 12, but the side surface 1081 of the first pad 108 is not covered by the reflective insulation layer 12. Moreover, each of the first metal bump 111 and the second metal bump 112 has a side surface 1111, 1121 directly covered by the reflective insulation layer 12, and a substantially flat bottom surface 1112, 1122 (described later). The reflective insulation layer 12 has a substantially flat bottom surface 121.

The wavelength conversion layer 13 is formed on a top surface 1012 of the substrate 101 and a top surface 122 of the reflective insulation layer 12. The wavelength conversion layer 13 can be arranged to not cover the side surfaces 1011, 1021, 1071 of the substrate 101, the first-type semiconductor layer 102, and the second insulation layer 107. The wavelength conversion layer 13 has a substantially flat top surface 131, a bottom surface 132 opposite to the top surface 131. In one embodiment, the wavelength conversion layer 13 further includes a plurality of wavelength conversion particles 133 arranged closer to the bottom surface 132 than the top surface 131. The wavelength conversion layer 13 has a particle concentration gradually decreasing from the top surface 131 to the bottom surface 132. The detailed description will be discussed later.

The substrate 101 can be made of a material, such as, sapphire, SiC, GaN, or GaAs, for epitaxially growing the first-type semiconductor layer 102, the active layer 103, and the second-type semiconductor layer 104 in sequence thereon. The substrate 101 has a thickness (T1) between 100 μm~250 μm as a mechanical support.

When the light-emitting diode 10 has a heterostructure, the first-type semiconductor layer 102 and the second-type semiconductor layer 104, for example a cladding layer or a confinement layer, provide holes and electrons, respectively, and each type layer has a bandgap greater than that of the active layer 103, thereby improving probability of electrons and holes combining in the active layer 103 to emit light. The first-type semiconductor layer 102, the active layer 103, and the second-type semiconductor layer 104 can include III-V group semiconductor material, such as $Al_xIn_yGa_{(1-x-y)}N$ or $Al_xIn_yGa_{(1-x-y)}P$, wherein $0 \le x$, $y \le 1$; $(x+y) \le 1$. Based on the material of the active layer 103, the light-emitting diode 10 can emit a red light with a peak wavelength or dominant wavelength of 610~650 nm; emit a green light with a peak wavelength or dominant wavelength of 530~570 nm; emit a blue light with a peak wavelength or dominant wavelength of 450~490 nm; emit a purple light with a peak wavelength or dominant wavelength of 400~440 nm, or emit a UV light with a peak wavelength of 200~400 nm.

The pad (108, 109) is made of metallic material(s), such as Ti, Ni, Au, Pt or Al. In one embodiment, the pad can be made in a multilayer structure of Ti/Al/Ni/Al/Ni/Al/Ni/Au, Ti/Al/Ti/Al/Ni/Au, or Ti/Pt/Al/Ni/Al/Ni/Au. The layer of Au is the bottommost layer for directly contacting the metal bumps. The first pad 108 is spaced apart from the second pad 109 by a shortest distance (D1) of 150 μm~300 μm.

The metal bump (111, 112) includes a lead-free solders containing at least one material selected from the group consisting of tin, copper, silver, bismuth, indium, zinc, and antimony. The metal bumps 111, 112 have a height (H1) between 20 μm~150 μm. In one embodiment, the metal bump is formed by using reflow soldering process. A solder paste is placed on the pad and then heated in a reflow oven to melt the solder paste and create a joint. The solder paste can include Sn—Ag—Cu, Sn—Sb or Au—Sn, and have a melting point greater than 215° C., or greater than 220° C., or of 215° C.~240° C. (for example, 217° C. 220° C., 234° C.) In addition, a peak temperature in the reflow soldering process (the peak temperature is usually happened in a stage, called "reflow zone") is greater than 250° C., or greater than 260° C., or of 250° C.~270° C. (for example, 255° C., 265° C.).

The reflective insulation layer 12 includes a first matrix and a plurality of reflective particles (not shown) dispersed in the first matrix. The first matrix includes silicone-based material or epoxy-based material, and has a refractive index (n) of 1.4~1.6 or 1.5~1.6. The reflective particles include titanium dioxide, silicon dioxide, aluminum oxide, zinc oxide, or zirconium dioxide. In one embodiment, when light emitted from the light-emitting diode 10 strikes the reflective insulation layer 12, the light can be reflected, and the reflection of light is referred to diffuse reflection. In addition to the reflection, the reflective insulation layer 12 can also function as a mechanical support and sustain the stress occurred during the operation of the light-emitting device 100. The reflective insulation layer 12 has a thickness (T2) between 120 μm~400 μm (≈T1+H1).

The wavelength conversion layer 13 includes a second matrix and a plurality of wavelength conversion particles 133 dispersed in the second matrix to absorb and convert a first light from the light-emitting diode 10 into a second light with a peak wavelength or dominant wavelength different from that the first light. The second matrix includes silicone-based material or epoxy-based material, and has a refractive index (n) of 1.4~1.6 or 1.5~1.6. The wavelength conversion particles 133 include one or more kinds of wavelength conversion materials. The wavelength conversion material includes yellow-greenish phosphor, red phosphor, or blue phosphor. The yellow-greenish phosphor includes YAG, TAG, silicate, vanadate, alkaline-earth metal selenide, or metal nitride. The red phosphor includes fluoride ($K_2TiF_6$:$Mn^{4+}$, $K_2SiF_6$:$Mn^{4+}$), silicate, vanadate, alkaline-earth metal sulfide, metal nitride oxide, a mixture of tungstate and molybdate. The blue phosphor includes $BaMgAl_{10}O_{17}$:$Eu^{2+}$. The first light can be mixed with the second light to produce a white light or a non-white light. In one embodiment, the white light has chromaticity coordinates (x, y) on CIE 1931 chromaticity diagram, wherein $0.275 \leq x \leq 0.285$: $0.23 \leq y \leq 0.26$. In other embodiment, the white light has a color temperature of 2200K~6500K (ex. 2200K, 2400K, 2700K, 3000K, 5700K, 6500K), and the chromaticity coordinates (x, y) is within a seven-step MacAdam ellipse on CIE 1931 chromaticity diagram. The non-white light can be a purple light or yellow light. In addition to the light conversion, the wavelength conversion layer 13 can be also functioned as a mechanical support provided it has an adequate thickness. For example, the wavelength conversion layer 13 has a thickness (T3) between 100 μm~350 μm. If the thickness (T3) is less than 100 μm, the wavelength conversion layer 13 may not have a sufficient rigidity to function as a support of the light-emitting device 100. If the thickness (T3) is greater than 350 μm, the total thickness of the light-emitting device 100 is usually too thick for a compact application, such as watch, belt, clothes, glasses, or other wearable device.

Referring to FIG. 1B, the metal bumps 111, 112 has a plurality of scratched lines 151 formed thereon and the scratched lines 151 can be observed by optical microscope. The scratched line 151 can also extend to areas other than the metal bumps 111, 112, such as a bottom surface 121 of the reflective insulation layer 12. Specifically, the scratched line 151 is substantially straight line which is continuously extended on the reflective insulation layer 12, the first metal bump, the reflective insulation layer 12, the second metal bump 112 and the reflective insulation layer 12. The detailed description will be discussed later.

Figure 1E:
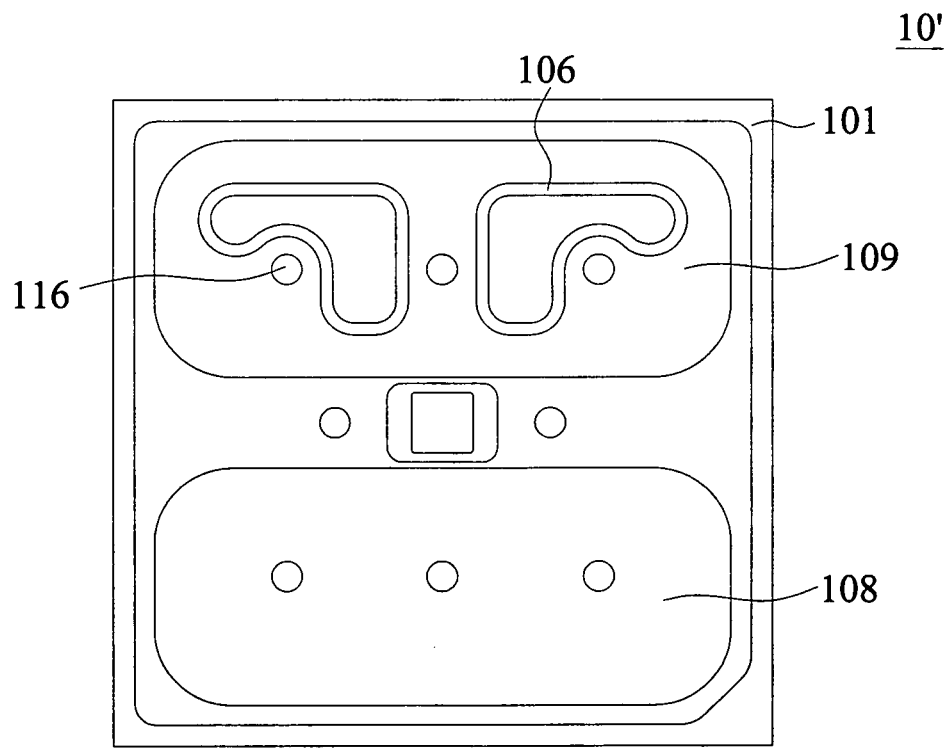
FIG. 1E is a bottom view of a light-emitting diode in accordance with one embodiment of the present disclosure.

FIG. 1E is a bottom view showing a light-emitting diode 10' in accordance with one embodiment of the present disclosure. As shown in FIG. 1D, only some layers are shown and each layer is drawn in a solid line regardless of an opaque, transparent or translucent material.

FIGS. 2A~2H are perspective views of steps of making a light-emitting device 100 in accordance with one embodiment of the present disclosure. FIGS. 3A~3H are cross-sectional views taken along lines II-II of FIGS. 2A~2H, respectively. For simplification, the light-emitting diode 10 and the light-emitting device 100 are shown in cuboids in FIGS. 2A~2H. The light-emitting diode 10 of FIGS. 3A~3H is also shown in the same way. The metal bumps 111,112 are not shown in FIGS. 2A~2H. The related detailed structures can be referred to descriptions directed to FIGS. 1A~1D.

Figure 2A:
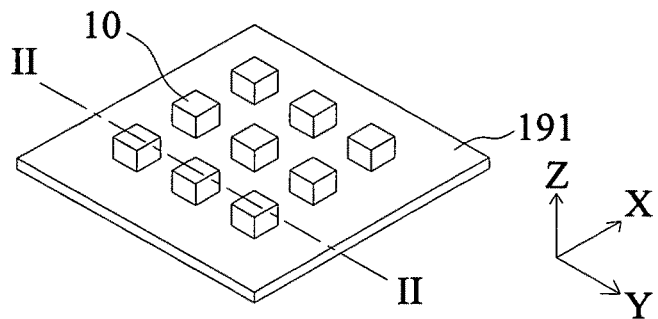
FIGS. 2A~2H are perspective views of steps of making a light-emitting device in accordance with an embodiment of the present disclosure.
Figure 3A:
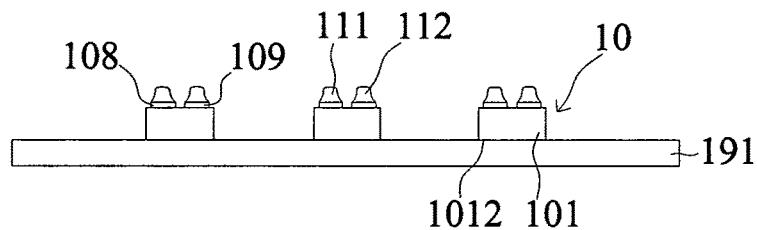
FIGS. 3A~3H are cross-sectional views taken along lines II-II of FIGS. 2A~2H, respectively.

Referring to FIGS. 2A and 3A, a plurality of light-emitting diodes 10 is provided (nine light-emitting diodes are shown in the drawing). A solder paste is coated on the pads 108, 109, and a reflow process is performed such that the metal bumps 111, 112 are formed to directly contact the pads 108, 109. The pads 108, 109 have a bottommost layer made of Au, and the solder paste is partially applied to the bottommost layer, i.e. the solder paste has a projection area smaller than the pad and covers only a part of the Au layer. With the wetting reaction between Au layer and the solder paste, the solder paste will spread out to fully cover the corresponding pads 108, 109, that is, the solder paste has a projection area substantially equal to that of the corresponding pads 108, 109 (not shown). Furthermore, after the reflow process, the solder paste can be solidified to form the metal bumps 111, 112. In this stage, each of the metal bumps 111, 112 is not subjected to a physical removal process (describer later) and has a contour without a sharp angle. The metal bumps 111, 112 have a cross-sectional area gradually decreasing along the Z axis. In addition, due to manufacturing deviations, the first metal bump 111 may have a shape different from that of the second metal bump 112. In FIG. 1C, the first metal bump 111 has a cross-sectional view different from the second metal bump 112.

After forming the metal bumps 111, 112, the light-emitting diodes 10 with the metal bumps 111, 112 are disposed on a first temporary tape 191. The top surface 1012 of the substrate 101 is attached to the first temporary tape 191. The metal bumps 111, 112 are not covered by the first temporary tape 191. In one embodiment, the number and arrangement of the light-emitting diodes 10 are exemplary, and not intended to limit the scope of the present disclosure.

Figure 2B:
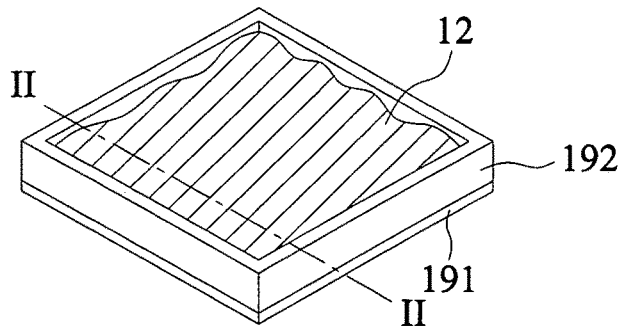
Figure 3B:
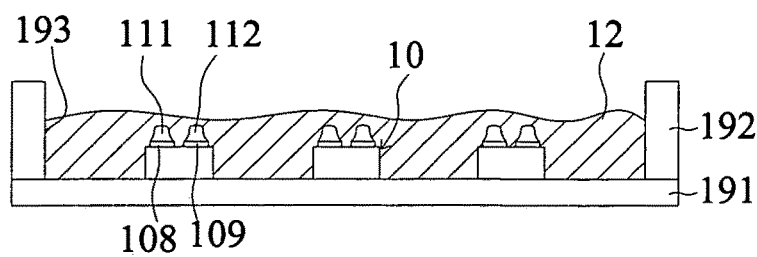

Referring to FIGS. 2B and 3B, a first dam 192 is optionally provided to confine a region 193 therein and to surround the light-emitting diodes 10. A plurality of reflective particles (not shown) is mixed with a first matrix to form a white paint which is in an uncured state, and then is added into the region 193 to cover the light-emitting diodes 10. Specifically, with the first dam 192, less amount of the white paint is used compared to that the case without the first dam 192. In addition, the light-emitting diodes 10 are immersed within the white paint and the metal bumps 111, 112 are not exposed to environment (for example, ambient air). Thereafter, a heat treatment is conducted to fully cure the white paint for forming the reflective insulation layer 12. The white paint has a viscosity of 0.5-1000 Pa·s (for example, 0.5, 1, 2, 10, 30, 100, 500, 1000) and the reflective insulation layer 12 (after fully curing the white paint) has a hardness of 40-90 (Shore D). Alternatively, the white paint has a viscosity of 100-10000 Pa·s (for example, 100, 300, 500, 1000, 5000, 10000) and the reflective insulation layer 12 has a hardness of 30-60 (Share D). In addition, the reflective insulation layer 12 has a reflectivity larger than 90% in a wavelength of 400 nm-800 nm.

Figure 2C:
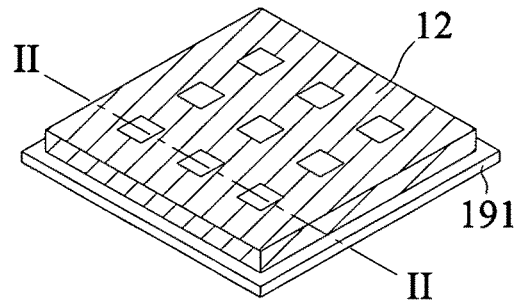
Figure 3C:
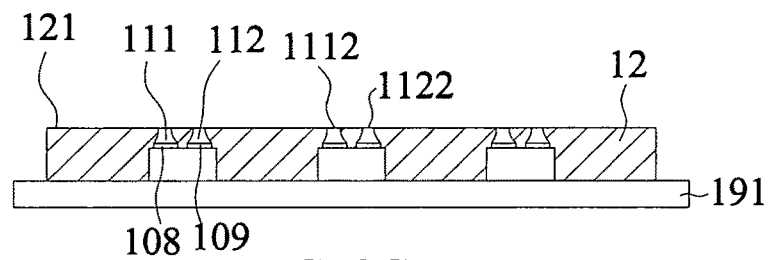

Referring to FIGS. 2C and 3C, the dam 192 is removed. A physical removal process (grinding or lapping) is performed until the metal bumps 111, 112 are exposed. The white paint is added into the region 193 by spraying or dispensing so as to have various thicknesses at different locations across its whole area. After curing, the white paint is solidified to form the reflective insulation layer 12 with various thicknesses at different locations across its whole area. During the physical removal process, part of the reflective insulation layer 12 is first removed and then portions of the reflective insulation layer 12 and the metal bumps 111, 112 are simultaneously removed, so the reflective insulation layer 12 and the metal bumps 111, 112 have bottom surfaces 121, 1112, 1122 substantially coplanar with each other and the bottom surfaces 121, 1112, 1122 becomes substantially flat. Moreover, since the metal bumps 111, 112 has a cross-sectioned area gradually decreasing along the Z axis, the exposed metal bumps 111, 112 has a shape substantially identical to the pads 108, 109, but has an area smaller than the pads 108, 109. The "substantially flat" is defined herein as when the light-emitting device 10 is observed by scanning electron microscope (SEM) at 60×~100× magnification, the bottom surfaces 121, 1112, 1122 are flat. However, when the light-emitting device 10 is observed by SEM at larger than 400× magnification, or measured by an alpha step film thickness measuring instrument or atomic force microscope (AFM), the reflective insulation layer 12 and the metal bumps 111, 112 has a rough bottom surfaces 121, 1112, 1122 and the roughness (Ra) for each of the rough bottom surfaces 121, 1112, 1122 is 2~3 $\mu m/mm^2$.

In one embodiment, the physical removal process is conducted using machinery cutters (for example, diamond blade). During the removal process, only water (no slurry or chemical solution) is provided to lower the temperature which is raised due to friction between the cutter and the reflective insulation layer 12, and to wash the residue including the removed reflective insulation layer 12 and the removed metal bump 111, 112. Moreover, since the diamond blade has a hardness larger than that of the reflective insulation layer 12 and the metal bumps 111, 112, a plurality of scratched lines 151 (see FIG. 1B) is formed thereon while inspecting using optical microscope. In other embodiment, by adjusting cutting parameters (for example, cutting speed or the material of the cutter), the scratched lines 151 may not be observed by optical microscope.

Figure 2D:
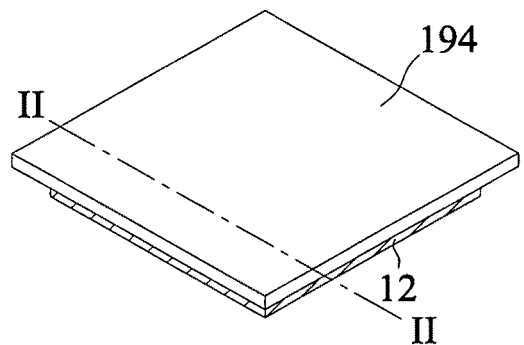
Figure 3D:
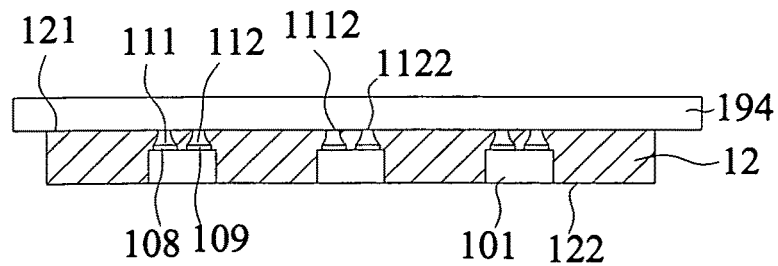

Referring to FIGS. 2D and 3D, a second temporary tape 194 is provided to attach to the bottom surface 121 of the reflective insulation layer 12 and the bottom surfaces 1112, 1122 of the metal bumps 111, 112, and then the first temporary tape 191 is removed to expose the substrate 101 and the top surface 122 of the reflective insulation layer 12.

Figure 2E:
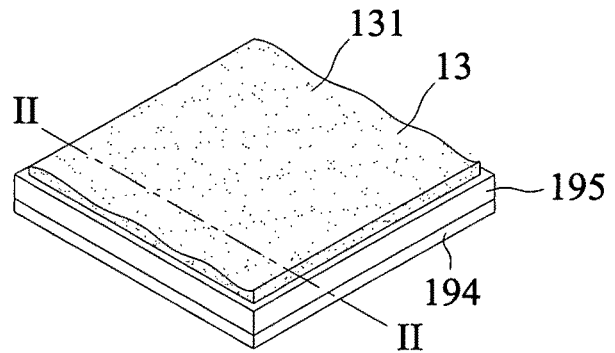
Figure 3E:
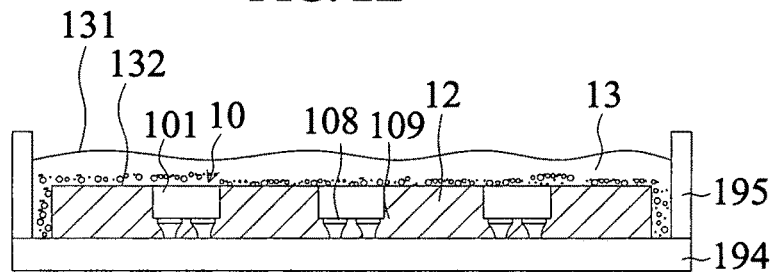

Referring to FIGS. 2E and 3E, the structure of FIG. 2D (or 3D) is reversed, and a second dam 195 is optionally provided to surround the reflective insulation layer 12, the light-emitting diodes 10 and the metal bumps 111, 112. A wavelength conversion mixture including a second matrix and a plurality of wavelength conversion particles dispersed in the second matrix is coated on the reflective insulation layer 12 and the substrate 101. Thereafter, a heat treatment is conducted to cure the mixture to form the wavelength conversion layer 13. In one embodiment, during the heat treatment, the wavelength conversion particles 133 will be precipitated because of the gravity and reach to the area near the bottom surface 132 before the second matrix is fully cured so the wavelength conversion layer 13 has the wavelength conversion particles 133 formed closer to the bottom surface 132. There are no wavelength conversion particles 133 existing at the area near the top surface 131.

Figure 2F:
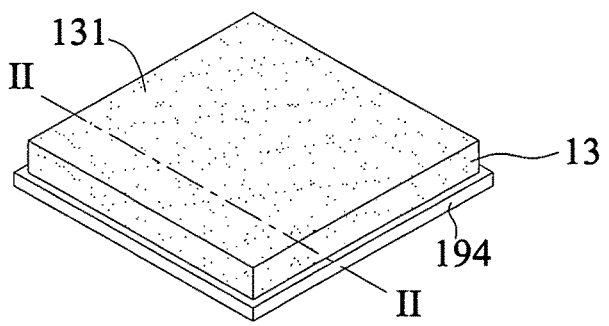
Figure 3F:
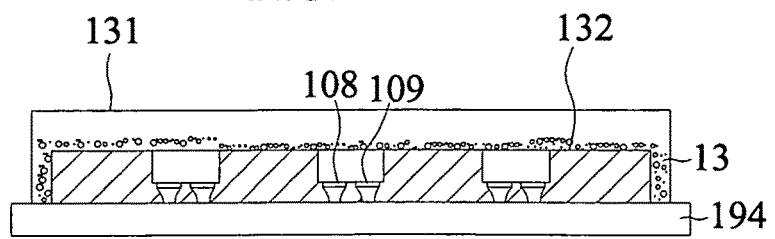

Referring to FIGS. 2F and 3F, the second dam 195 is removed and the physical removal process is performed. Similarly, the wavelength conversion mixture is coated on the reflective insulation layer 12 and the substrate 101 by spraying or dispensing so as to have various thicknesses at different locations across its whole area. After curing, the wavelength conversion mixture is solidified to form the wavelength conversion layer 13 with various thicknesses at different locations across its whole area. After the physical removal process to remove portions of the wavelength conversion layer 13, the whole top surface 131 of the wavelength conversion layer 13 becomes substantially flat so as to reduce the difference among a plurality of individual light-emitting devices 100, which are formed by subsequent separation step, thereby improving process yield. The difference means light intensity (lumen), color temperature, light pattern, or color over angle. Since the wavelength conversion particles 133 is formed at a position closer to the bottom surface 132, the second matrix can be removed without removing the wavelength conversion particles 133 such that the color temperature of the light-emitting device 100 can remain the same before and after the physical removal process. However, the light pattern can be kept the same or changed after the physical removal process.

In addition, there will be a plurality of scratched lines 151 (see FIG. 1B) on the top surface 131, and the average surface roughness (Ra=2~3 $\mu m/mm^2$) of the wavelength conversion layer 13 is larger than that before applying the physical removal process. Accordingly, the top surface 131 is modified to reduce a sticky characteristic between the wavelength conversion layer 13 and the catcher (for example, suction nozzle) which is used in the subsequent transferring step. In another embodiment, the top surface 131 can be coated with an anti-sticky material to reduce the sticky issue. The anti-sticky material includes a Cr-based material (Cr or $Cr_2N$) with a thickness less than 50 Å or a fluoro-based material ($CaF_2$) with a thickness of 1~10 $\mu m$ for light transmission therethrough.

Figure 2G:
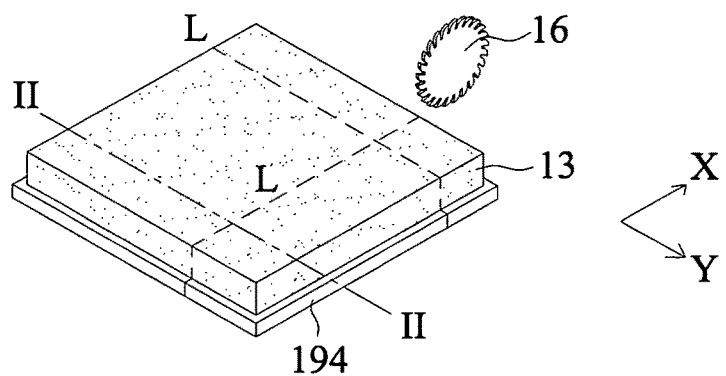
Figure 3G:
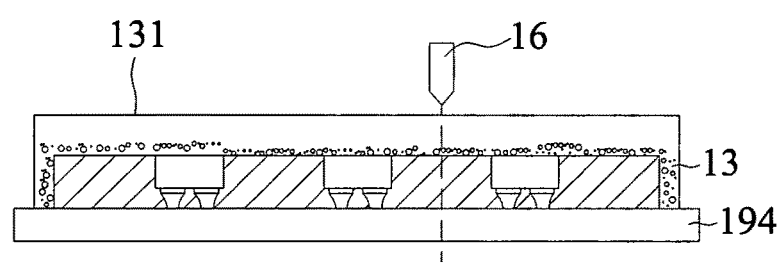

Referring to FIGS. 2G and 3G, a cutter 16 is provided and a dicing process is performed from the wavelength conversion layer 13 along the cutting line (L) in the X and Y directions to obtain a plurality of separated light-emitting devices 100.

Figure 2H:
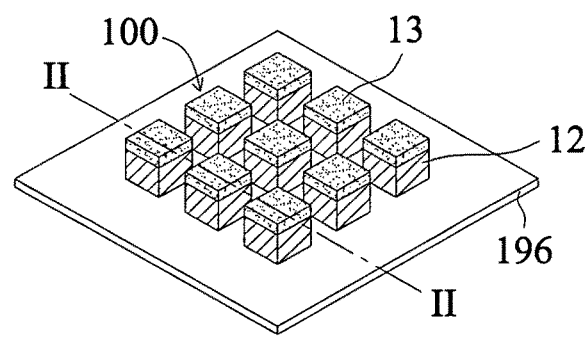
Figure 3H:
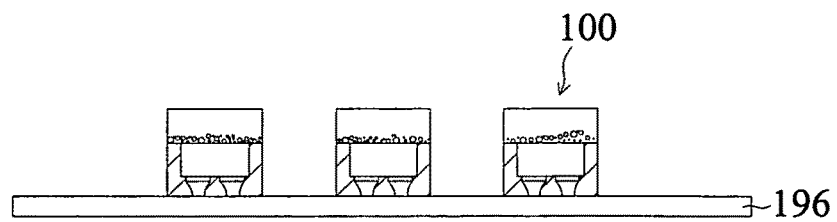

Referring to FIGS. 2H and 3H, a transferring step is performed to transfer the light-emitting devices 100 to a third temporary tape 196 by using a catcher (not shown) for subsequent testing and/or binning.

Figure 4A:
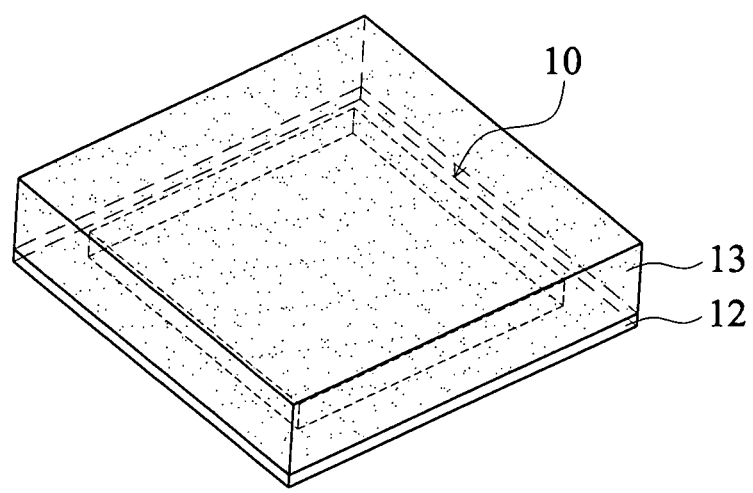
FIG. 4A is a perspective view of a light-emitting device in accordance with a further embodiment of the present disclosure.
Figure 4B:
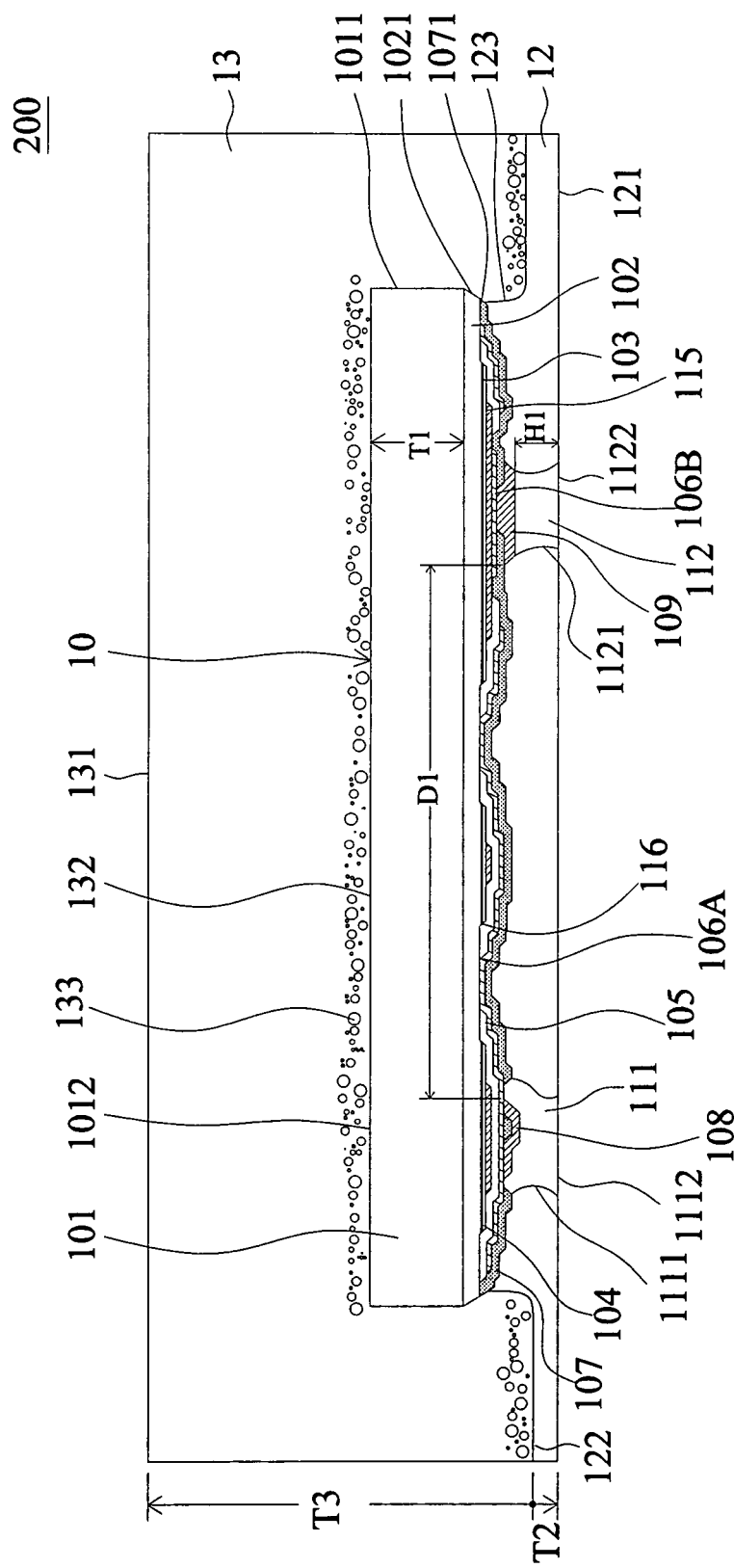
FIG. 4B is a cross-sectional view of the light-emitting device shown in FIG. 4A.

FIG. 4A is a perspective view of a light-emitting device 200 in accordance with a second embodiment of the present disclosure. FIG. 4B is a cross-sectional view of FIG. 4A. The light-emitting device 200 of FIG. 4B has a similar structure to that of FIG. 1C, and devices or elements with similar or the same symbols represent those with the same or similar functions. Referring to FIGS. 4A and 4B, the reflective insulation layer 12 is formed to surround the light-emitting diode 10 and the metal bumps 111, 112. Specifically, portions of the side surface 1071 of the second insulation layer 107, and the side surfaces 1111, 1121 of the first metal bump 111 and the second metal bump 112 are directly covered by the reflective insulation layer 12. The reflective insulation layer 12 does not directly cover the side surface 1011, 1021 of the substrate 101 and the second-type semiconductor layer 102.

The wavelength conversion layer 13 is formed on a top surface 1012 of the substrate 101 and to directly cover a side surface 123 of the reflective insulation layer 12 and the side surfaces 1011, 1021 of the substrate 101 and the second-type semiconductor layer 102. In addition, the wavelength conversion particles 133 do not cover the side surface 1011 of the substrate 101.

FIGS. 5A~5H are perspective views of steps for making a light-emitting device 200 in accordance with an embodiment of the present disclosure. FIGS. 6A~6H are cross-sectional views taken along lines II-II of FIGS. 5A~5H, respectively. For simplification, the light-emitting diode 10 and the light-emitting device 200 are shown in cuboids in FIGS. 5A~5H and the light-emitting diode 10 of FIGS. 6A~6H is also shown in the same way. The related detailed structures can be referred to descriptions directed to FIGS. 4A~4B.

Figure 5A:
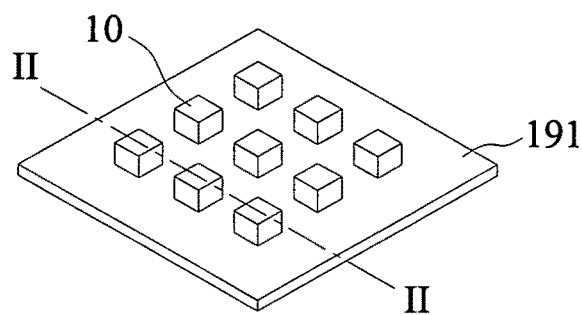
FIGS. 5A~5H are perspective views of steps of making a light-emitting device in accordance with an embodiment of the present disclosure.
Figure 6A:
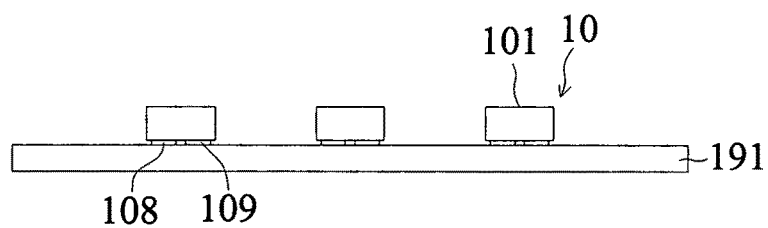
FIGS. 6A~6H are cross-sectional views taken along lines II-II of FIGS. 5A~5H, respectively.

Referring to FIGS. 5A and 6A, a plurality of light-emitting diodes 10 (nine light-emitting diodes are shown) is disposed on to a first temporary tape 191. The pads 108, 109 are attached to the first temporary tape 191 and the substrate 101 is not covered by the first temporary tape 191. In one embodiment, the number and arrangement of light-emitting diodes 10 are exemplary, and not intended to limit the scope of the present disclosure.

Figure 5B:
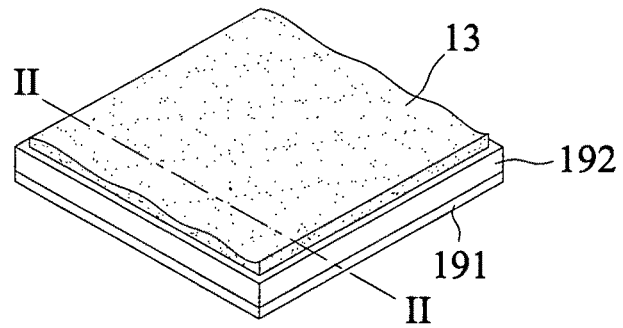
Figure 6B:
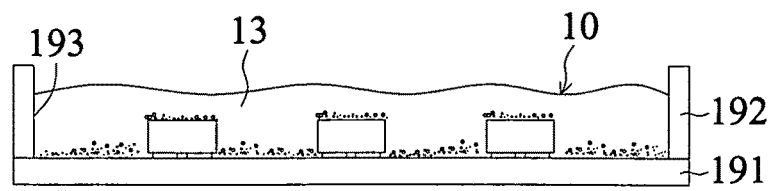

Referring to FIGS. 5B and 6B, a first dam 192 is optionally provided to confine a region 193 therein and to surround the light-emitting diodes 10. A wavelength conversion mixture including a second matrix and a plurality of wavelength conversion particles dispersed therein is added into the region 193 to cover the light-emitting diodes 10. Specifically, with the first dam 192, less amount of the wavelength conversion mixture is used compared to that the case without the first dam 192. In addition, the light-emitting diodes 10 are immersed within the wavelength conversion mixture and not exposed to environment (for example, ambient air). Thereafter, a heat treatment is conducted to fully cure the wavelength conversion mixture for forming the wavelength conversion layer 13. In one embodiment, the wavelength conversion particles 133 will be precipitated because of the gravity which causes the wavelength conversion particles 133 do not cover the side surface 1011 of the substrate 101. The other related description can be referred to the corresponding paragraph.

Figure 5C:
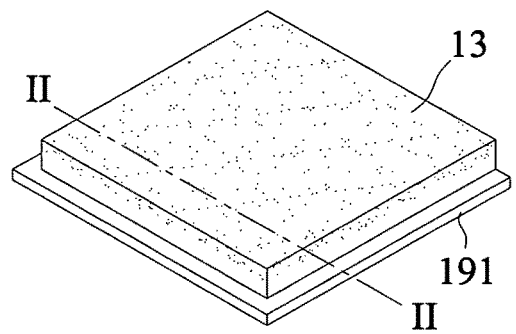
Figure 6C:
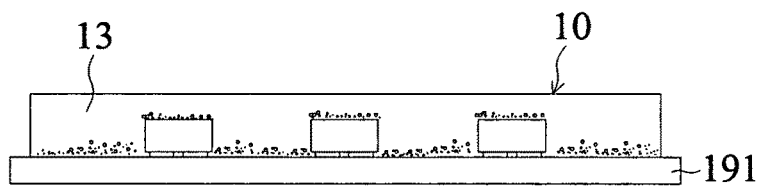

Referring to FIGS. 5C and 6C, the first dam 192 is removed and the physical removal process is performed. Therefore, the wavelength conversion layer 13 has a substantially flat top surface 131. The process of FIGS. 5C and 6C are similar to those in FIGS. 2F and 3F. The descriptions can be referred to the related paragraphs and are omitted herein for brevity.

Figure 5D:
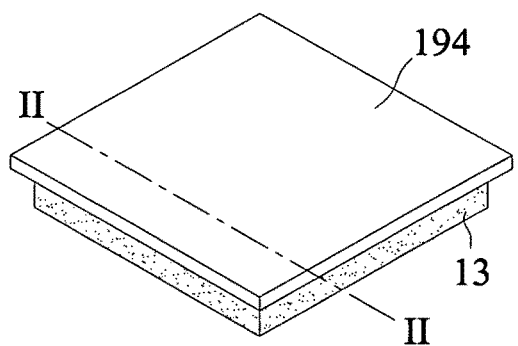
Figure 6D:
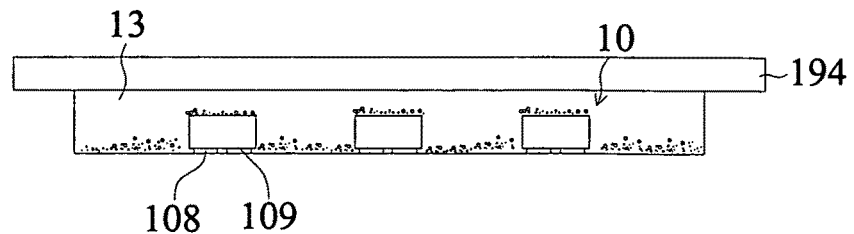

Referring to FIGS. 5D and 6D, a second temporary tape 194 is provided to attach to the wavelength conversion layer 13, and then the first temporary tape 191 is removed to expose the pads 108, 109.

Figure 5E:
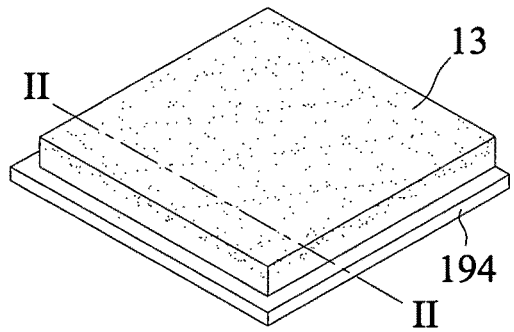
Figure 6E:
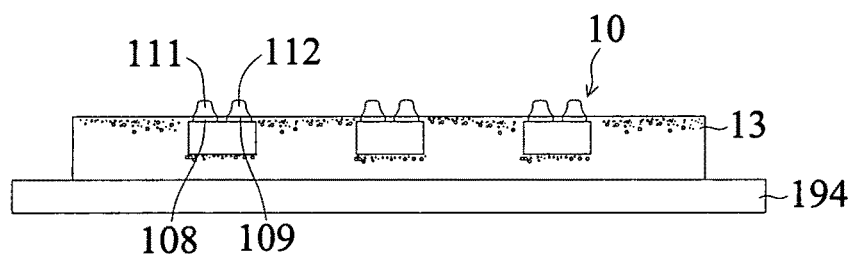

Referring to FIGS. 5E and 6E, the structure of FIGS. 5D and 6D is reversed. A solder paste is coated on the pads 108, 109 and a reflow process is performed to form the metal bumps 111, 112 directly contacting the pads 108,109. The other detailed descriptions of the solder paste can be referred to paragraphs directed to FIGS. 2A and 3A, and are omitted herein for brevity.

Figure 5F:
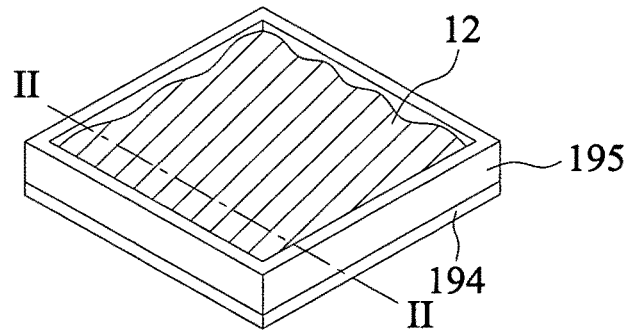
Figure 6F:
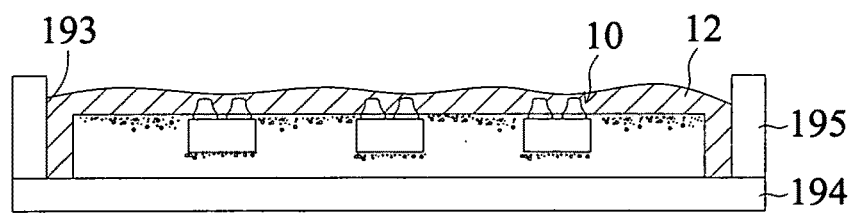

Referring to FIGS. 5F and 6F, a second dam 195 is optionally provided to surround the wavelength conversion layer 13 and the light-emitting diodes 10. A plurality of reflective particles is mixed with a first matrix to form a white paint in an uncured state, and then is added to cover the wavelength conversion layer 13 and the light-emitting diodes 10. Specifically, with the second dam 195, less amount of the white paint is used compared to that the case without using the second dam 195. In addition, the light-emitting diodes 10 with the metal bumps 111, 112 formed thereon and the wavelength conversion layer 13 are immersed within the white paint, and are not exposed to environment (for example, ambient air). Thereafter, a heat treatment is conducted to fully cure the white paint for forming the reflective insulation layer 12.

Figure 5G:
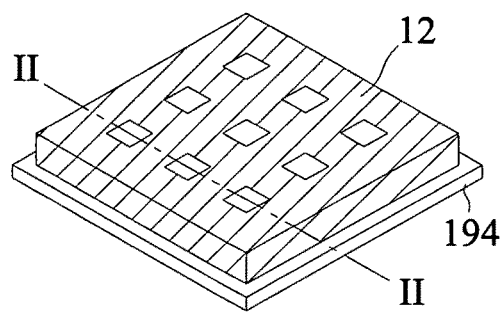
Figure 6G:
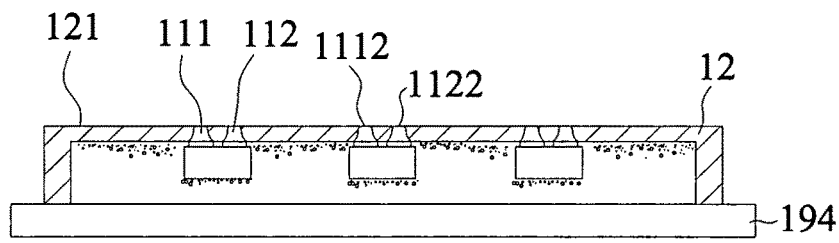

Referring to FIGS. 5G and 6G, the second dam 195 is removed. A physical removal process is performed until the metal bumps 111, 112 are exposed. Likewise, during the physical removal process, the reflective insulation layer 12 and the metal bumps 111, 112 are simultaneously removed, so the reflective insulation layer 12 and the metal bumps 111, 112 have bottom surfaces 121, 1112, 1122 substantially coplanar with each other and the bottom surfaces 121, 1112, 1122 becomes substantially flat. The other related descriptions can be referred to those paragraphs described in FIGS. 2C and 3C, and are omitted herein for brevity.

Figure 5H:
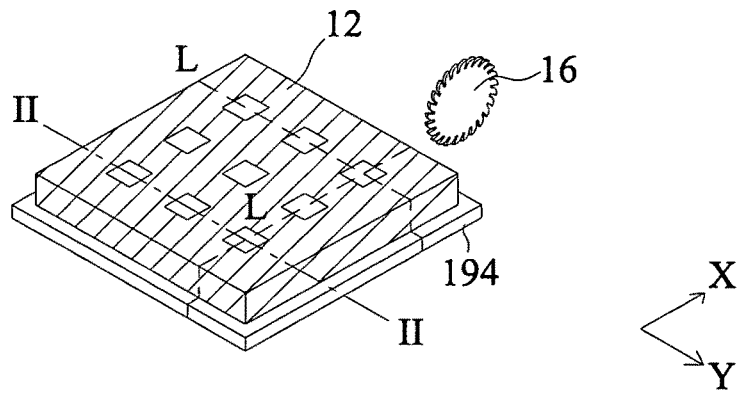
Figure 6H:
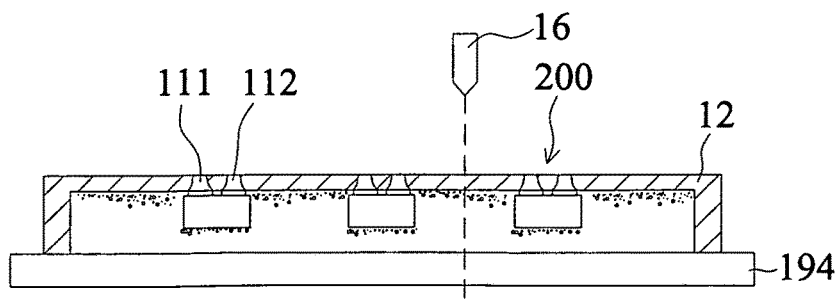

Referring to FIGS. 5H and 6H, a cutter 16 is provided and a dicing process is performed from the metal bumps 111, 112 along the cutting line (L) in the X and Y directions to obtain a plurality of separated light-emitting devices 200. Subsequently, a transferring step (it can be referred to FIGS. 2H and 3H) is performed to transfer the light-emitting devices 200 to a third temporary tape 196 by using a catcher for subsequent testing and/or binning.

Figure 7A:
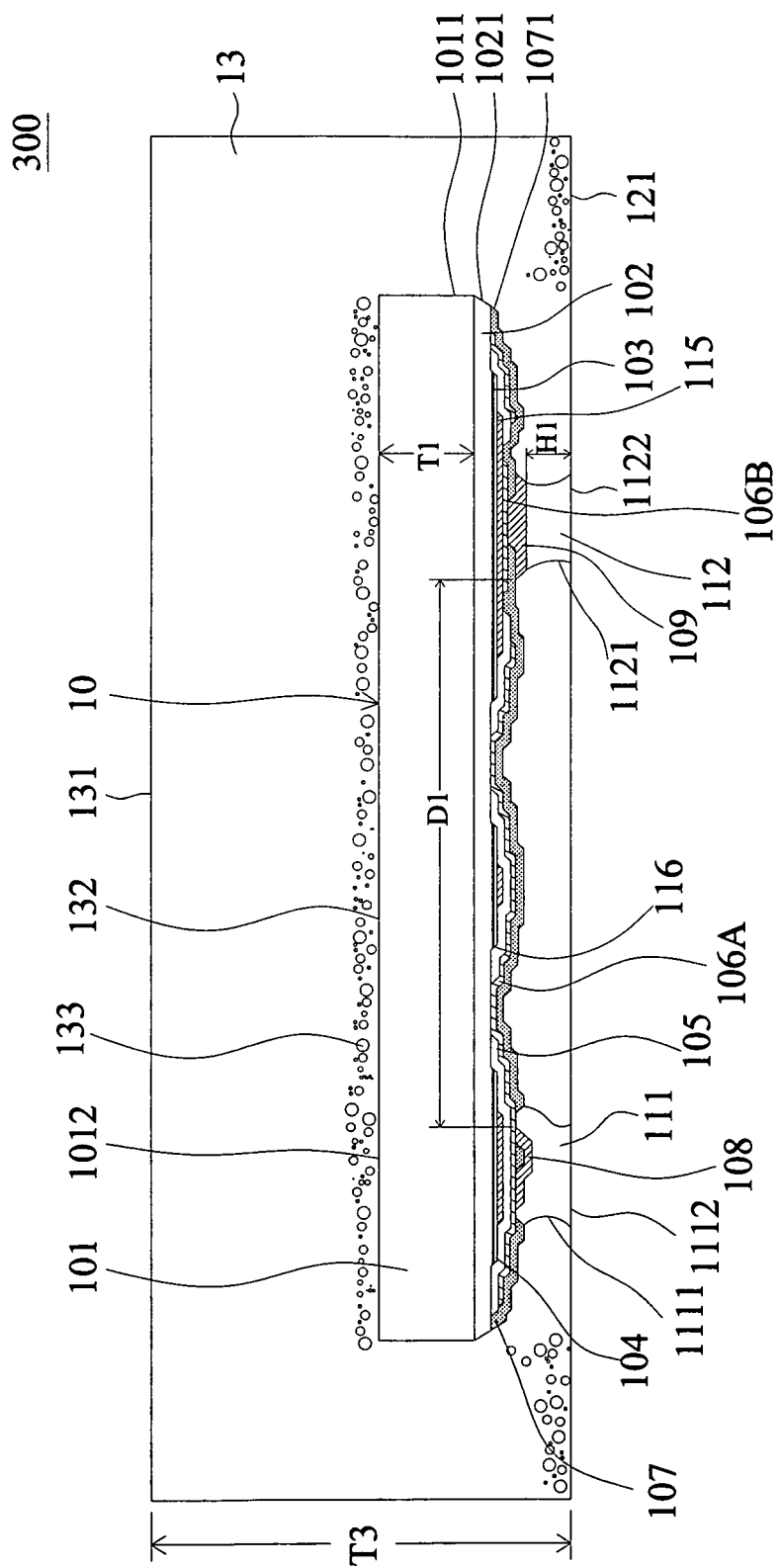
FIG. 7A is a perspective view of a light-emitting device in accordance with an embodiment of the present disclosure.
Figure 7B:
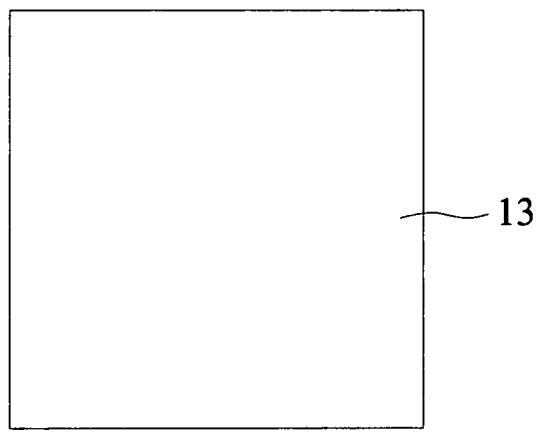
FIG. 7B is a cross-sectional view of light-emitting device shown in FIG. 7A.

FIG. 7A is a perspective view of a light-emitting device 300 in accordance with further embodiment of the present disclosure. FIG. 7B is a cross-sectional view of FIG. 7A. The light-emitting device 300 of FIG. 7B has a similar structure to that of FIG. 1C. Devices or elements with similar or the same symbols represent those with the same or similar functions. Referring to FIG. 7A, the wavelength conversion layer 13 is formed to surround the light-emitting diode 10 and the metal bumps 111, 112. Specifically, the side surfaces 1011, 1021, 1071, 1111, 1121 of a substrate 101, a first-type semiconductor layer 102, a second insulation layer 107, the first metal bump 111, and the second metal bump 112 are directly covered by the wavelength conversion layer 13. Each of the first metal bump 111 and the second metal bump 112 has a substantially flat bottom surface 1112, 1122. The other related descriptions can be referred to other embodiments, and are omitted herein for brevity.

FIGS. 8A~8E are perspective views of steps for making a light-emitting device 300 in accordance with one embodiment of the present disclosure. FIGS. 9A~9E are cross-sectional views taken along lines II-II of FIGS. 8A~8E, respectively. For simplification, the light-emitting diode 10 and the light-emitting device 300 are shown in cuboids in FIGS. 8A~8G. The light-emitting diode 10 of FIGS. 9A~9E shown in is also shown in the similar way. The related structures can be referred to descriptions directed to FIGS. 7A~7B.

Figure 8A:
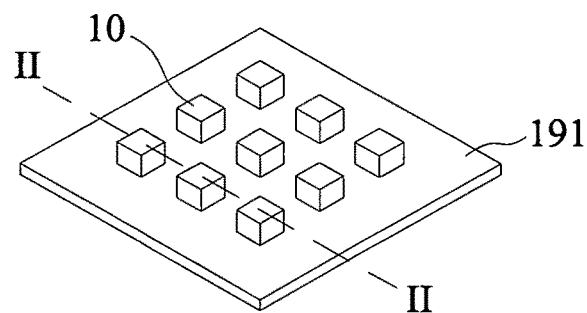
FIGS. 8A~8E are perspective views of steps of making a light-emitting device in accordance with an embodiment of the present disclosure.
Figure 9A:
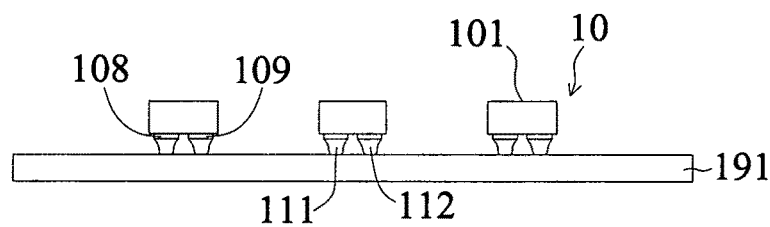
FIGS. 9A~9E are cross-sectional views taken along lines II-II of FIGS. 8A~8E, respectively.
Figure 9B:
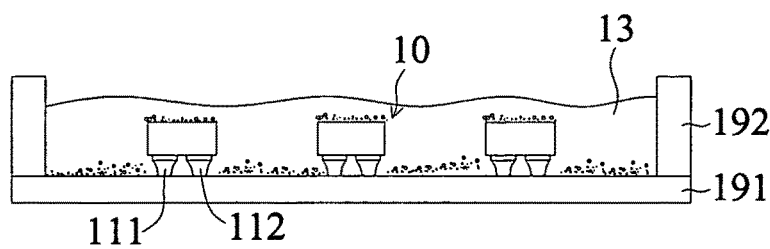
Figure 9C:
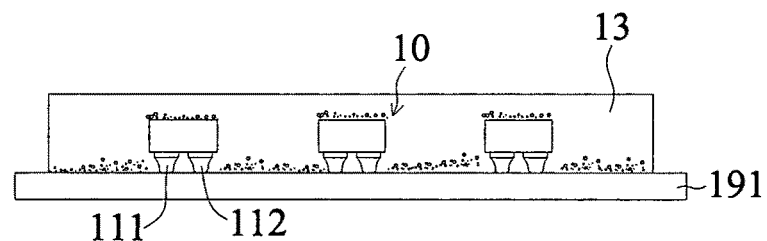
Figure 9D:
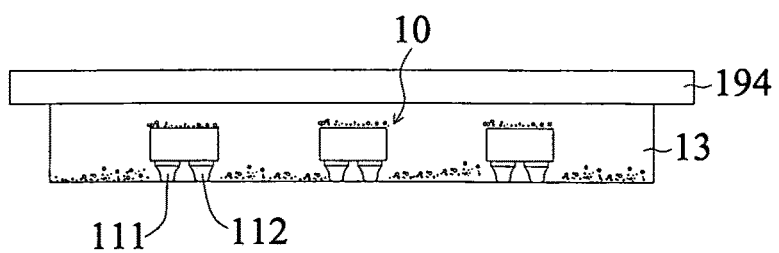

Referring to FIGS. 8A and 9A, a plurality of light-emitting diodes 10 is provided. A solder paste is coated on the pads 108, 109 and a reflow process is performed to form the metal bumps 111, 112 directly contacting the pads 108, 109. The detailed descriptions of the solder paste can be referred to paragraphs directed to FIGS. 2A and 3A, and are omitted herein for brevity.

After forming the metal bumps 111, 112, the light-emitting diodes 10 (for example, nine light-emitting diodes are shown) with the metal bumps 111, 112 are disposed onto a first temporary tape 191. The metal bumps 111, 112 are attached to the first temporary tape 191 and the substrate 101 is not covered by the first temporary tape 191. In one embodiment, the number and arrangement of light-emitting diodes 10 are exemplary, and not intended to limit the scope of the present disclosure.

The process of FIGS. 8B~8D and 9B~8D are similar to that of FIGS. 5B~5D and 6B~6D, respectively. Therefore, the detailed descriptions can be referred to paragraphs directed to the same, and are not described herein.

Figure 8B:
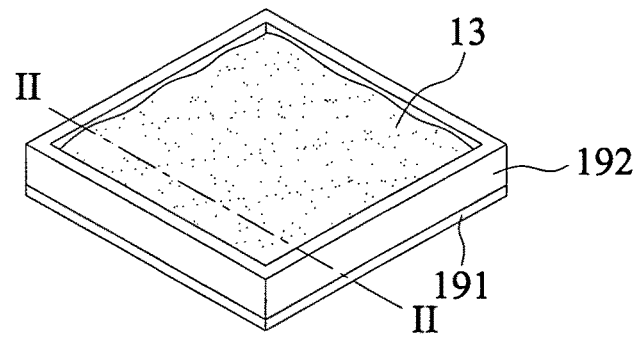
Figure 8C:
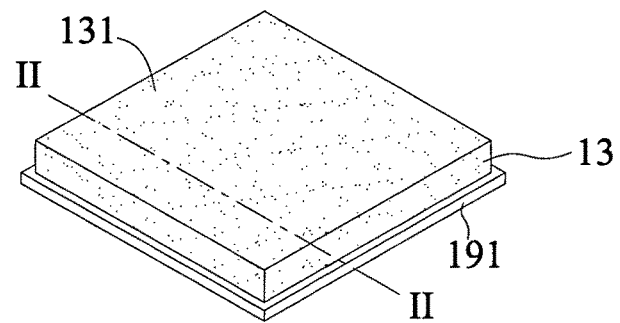
Figure 8D:
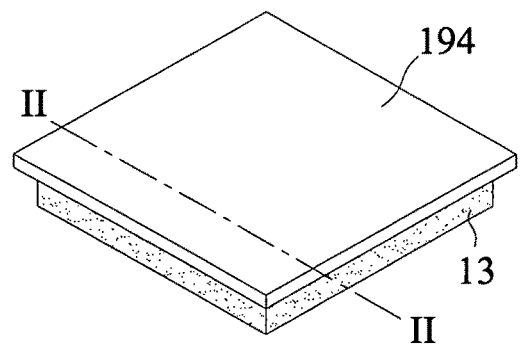
Figure 8E:
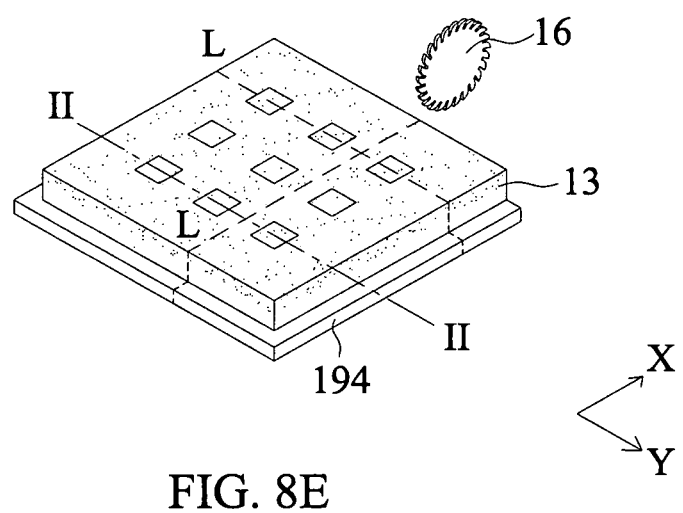
Figure 9E:
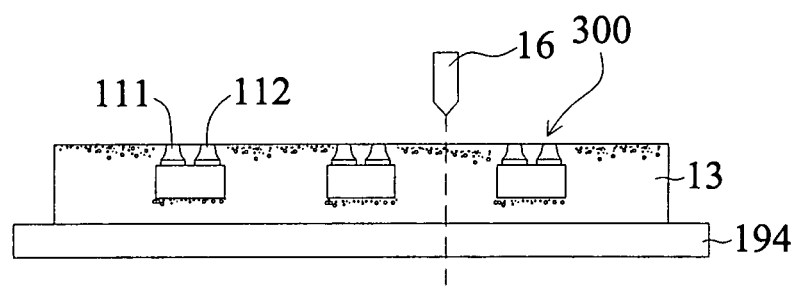

Referring to FIGS. 8E and 9E, a cutter 16 is provided and a dicing process is performed from the metal bumps 111, 112 along the cutting line (L) in the X and Y directions to obtain a plurality of separated light-emitting devices 300. Subsequently, a transferring step (referring to FIGS. 2H and 3H) is performed to transfer the light-emitting devices 300 to a third temporary tape 196 by using a catcher for subsequent testing and/or binning.

Figure 10A:
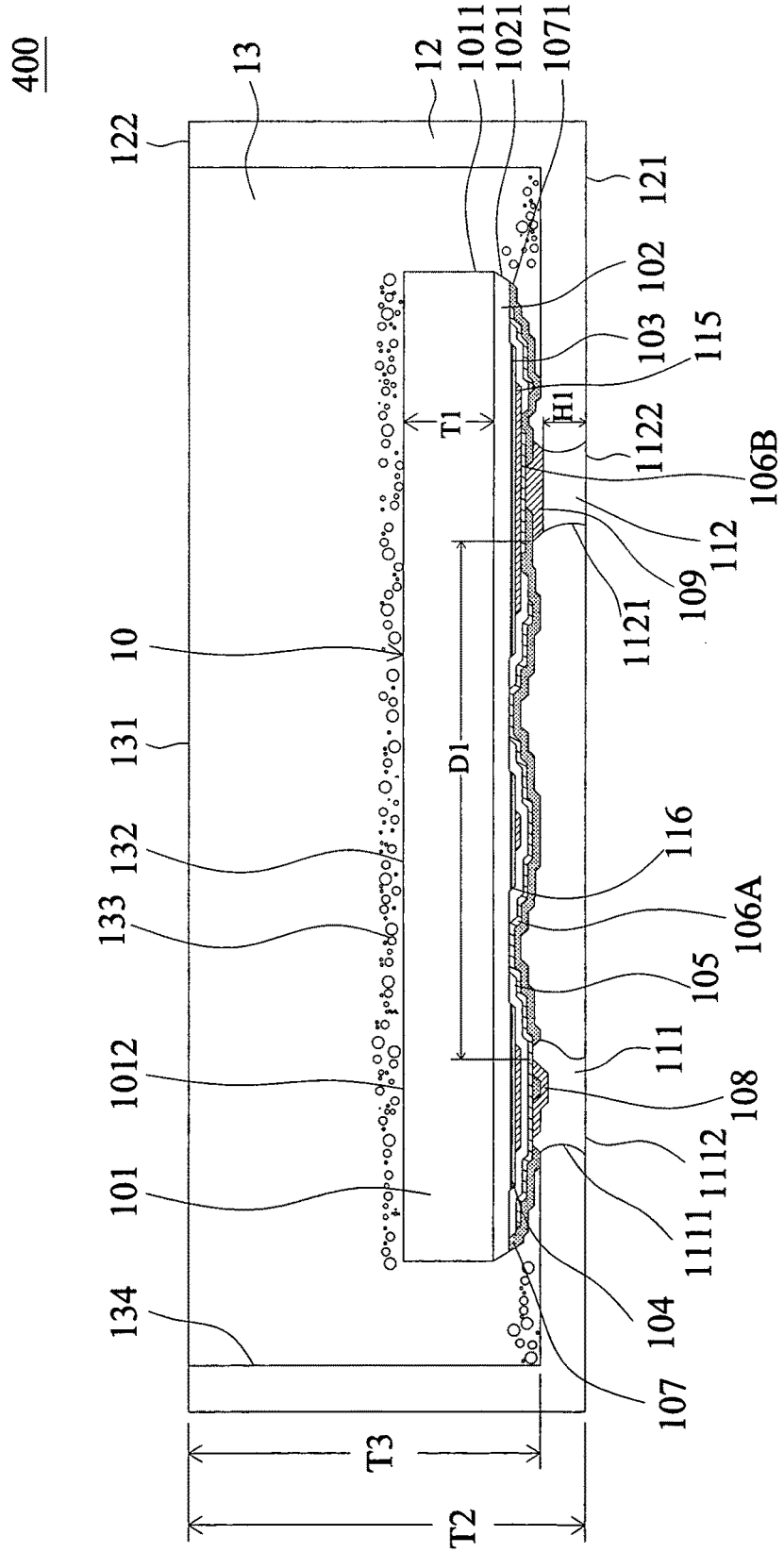
FIG. 10A is a cross-sectional view of a light-emitting device in accordance with an embodiment of the present disclosure.
Figure 10B:
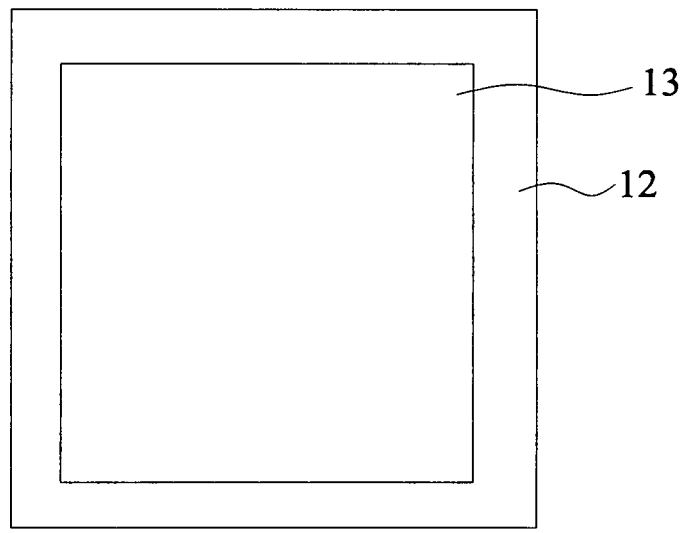
FIG. 10B is a top view of the light-emitting device shown in FIG. 10A.

FIG. 10A is a cross-sectional view of a light-emitting device 400 in accordance with one embodiment of the present disclosure. FIG. 10B is a top view of FIG. 10A. The light-emitting device 400 of FIG. 10A has a similar structure to that of FIG. 7A, and devices or elements with similar or the same symbols represent those with the same or similar functions. In one embodiment, the wavelength conversion layer 13 does not cover the side surfaces 1111, 1121 of the metal bumps 111, 112. The reflective insulation layer 12 surrounds the light-emitting diode 10, the wavelength conversion layer 13 and the metal bumps 111, 112. Specifically, the reflective insulation layer 12 directly cover the side wall 134 of the wavelength conversion layer 13 and the side surfaces 1111, 1121 of the metal bumps 111, 112. The physical removal process can be performed to remove part of the reflective insulation layer 12 and the wavelength conversion layer 13, therefore, the reflective insulation layer 12 has a substantially flat top surface 122 and the wavelength conversion layer 13 also has a substantially flat top surface 132.

Figure 11A:
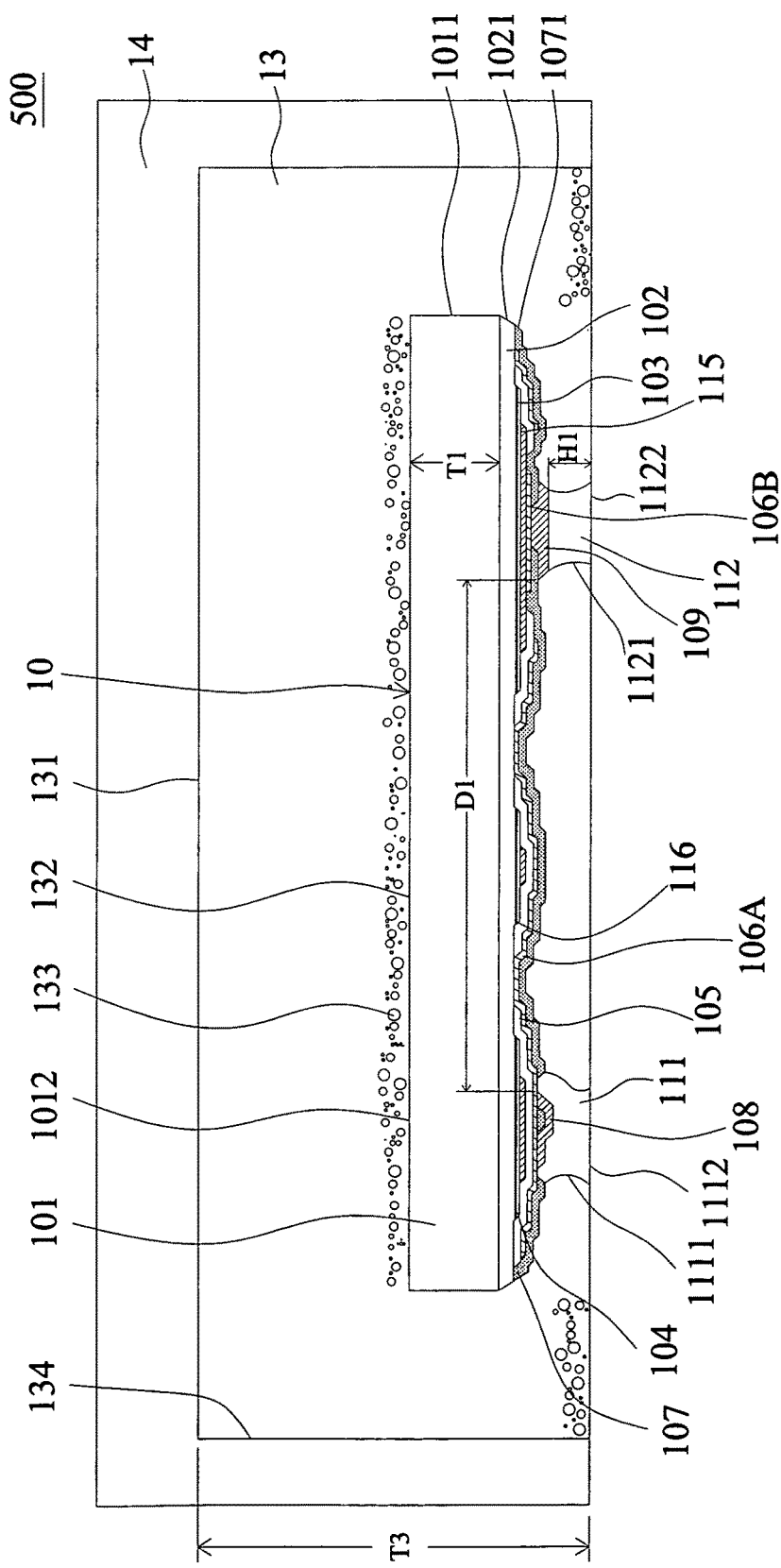
FIG. 11A is a cross-sectional view of a light-emitting device in accordance with an embodiment of the present disclosure.
Figure 11B:
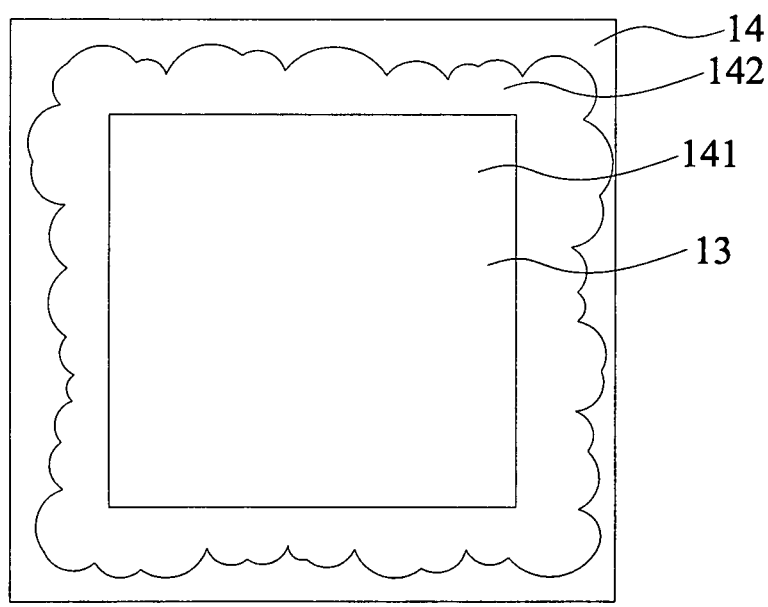
FIG. 11B is a top view of the light-emitting device shown in FIG. 11A.

FIG. 11A is a cross-sectional view of a light-emitting device 500 in accordance with an embodiment of the present disclosure. FIG. 11B is a top view of FIG. 11A. The light-emitting device 500 of FIG. 11A has a similar structure to that of FIG. 7A, and devices or elements with similar or the same symbols represent those with the same or similar functions. In one embodiment, a diffuser layer 14 is further provided to cover and enclose the wavelength conversion layer 13. Specifically, the top surface 131 and side surface 134 are directly covered by the diffuser layer 14. In FIG. 11B, since the diffuse layer 14 is not opaque, a first area 141 below which the wavelength conversion layer 13 is formed appears a yellow color to human eye. In addition, with the diffuser layer 14 for diffusing light, a second area 142 below which the wavelength conversion layer 13 is not formed also appears a yellow color to human eye. When the light-emitting device 500 is observed by optical microscope, the yellow color at the second area 142 looks like a yellow light halo.

The diffuse layer 14 has a transparency larger than 50% in a wavelength of 400 nm-800 nm and have a plurality of diffuser particles (not shown) mixed in a third matrix. The third matrix includes silicone-based material or epoxy-based material, and has a refractive index (n) of 1.4~1.6 or 1.5~1.6. The diffuser particles include titanium dioxide, silicon dioxide, aluminum oxide, zinc oxide, or zirconium dioxide. The diffuser particles in the third matrix have a weight concentration (w/w) of 0.01-0.1%.

Figure 12A:
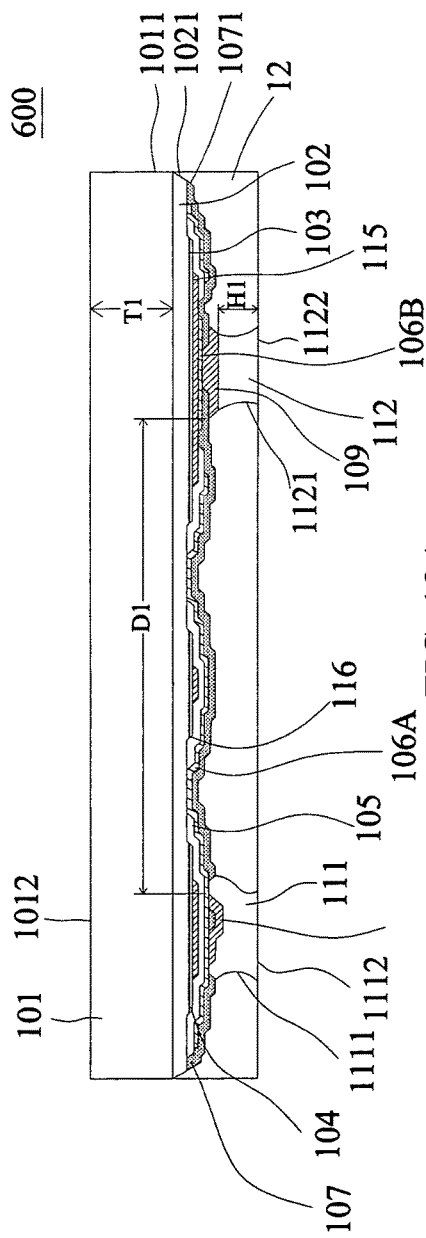
FIG. 12A is a cross-sectional view of a light-emitting device in accordance with an embodiment of the present disclosure.

FIG. 12A is a cross-sectional view of a light-emitting device 600 in accordance with an embodiment of the present disclosure. The light-emitting device 600 includes a light-emitting diode 10, first and second metal bumps 111, 112, and a reflective insulation layer 12. The detailed structure of the light-emitting diode 10 can be referred to other embodiments and is omitted herein for brevity. The reflective insulation layer 12 surrounds portions of the light-emitting diode 10, the second pad 109, and the metal bumps 111, 112. Specifically, the reflective insulation layer 12 directly cover the side surfaces 1021, 1071, 1091, 1111, 1121 of the first-type semiconductor layer 102, the second insulation layer 107, the second pad 109, the first metal bump 111 and the second metal bump 112 but does not cover the side surface 1011 of the substrate 101.

Figure 12B:
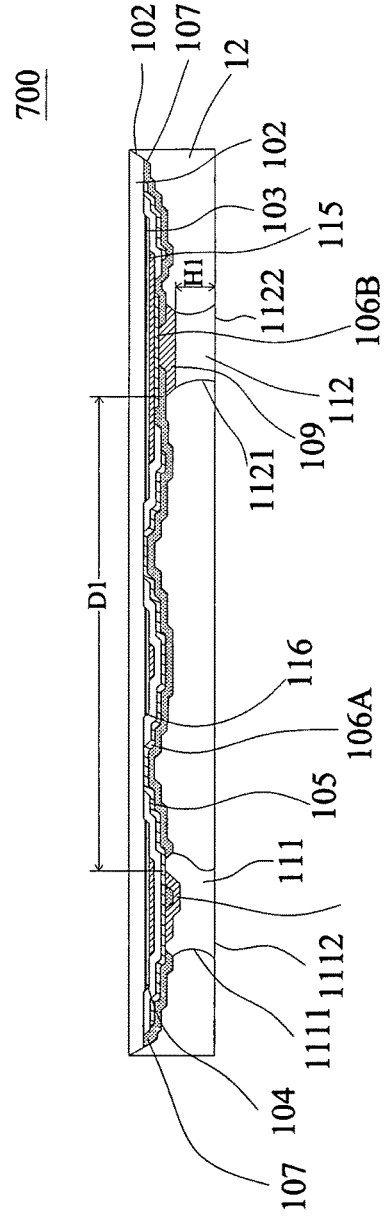
FIG. 12B is a cross-sectional view of a light-emitting device in accordance with an embodiment of the present disclosure.

FIG. 12B is a cross-sectional view of a light-emitting device 700 in accordance with one embodiment of the present disclosure. The light-emitting device 700 of FIG. 12B has a similar structure to that of FIG. 12A, and devices or elements with similar or the same symbols represent those with the same or similar functions. In one embodiment, the substrate 101 is removed to expose the first-type semiconductor layer 102. A buffer structure (not shown) may be formed between the substrate 101 and the first-type semiconductor layer 102 for improving the epitaxial quality. Accordingly, when the substrate 101 is removed, the buffer structure is exposed. The buffer structure can include an undoped semiconductor layer and/or a superlattice layer or other layers known in the art.

Figure 13A:
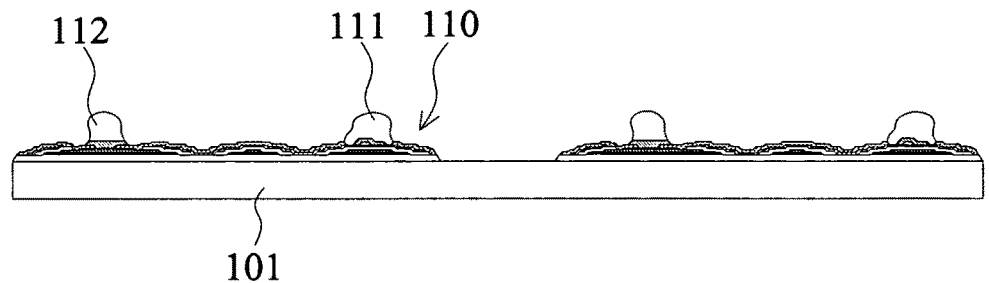
FIGS. 13A~13C are cross-sectional views of steps of making a light-emitting device in accordance with an embodiment of the present disclosure.
Figure 13B:
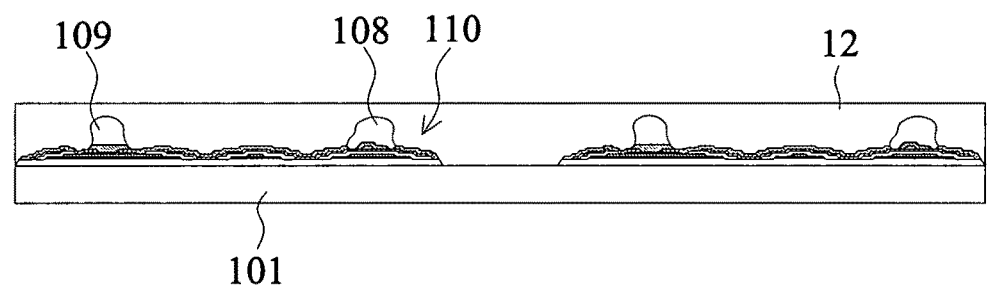
Figure 13C:
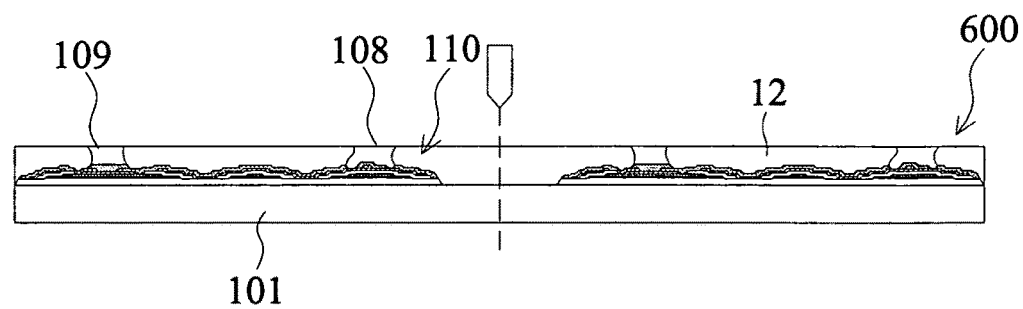

FIGS. 13A~13C are cross-sectional views of steps of making a light-emitting device 600 in accordance with an embodiment of the present disclosure. Referring to FIG. 13A, a plurality of separated light-emitting stacks 110 (only two are shown) is epitaxially formed on a substrate 101. The light-emitting stacks 110 includes a first-type semiconductor layer 102, an active layer 103, a second-type semiconductor layer 104, a first insulation layer 105, an electrical connection layer 106 (106A, 106B), a second insulation layer 107, a first pad 108, and a second pad 109. To avoid the complexity in the drawings, the layers 102~109 are not labeled in FIG. 13A~13C. A solder paste is coated on the pads 108, 109 and a reflow process is performed to form the first and second metal bumps 111, 112 directly contacting the pads 108, 109. The detailed descriptions of the solder paste can be referred to paragraphs directed to FIGS. 2A and 3A, and are omitted herein for brevity.

Referring to FIG. 13B, a plurality of reflective particles is mixed with a first matrix to form a white paint in an uncured state, and then is coated to cover the light-emitting stacks 110 and the metal bumps 111, 112. In addition, the light-emitting stacks 110 and the metal bumps 111, 112 are immersed within the white paint. The metal bumps 111, 112 are not exposed to environment (for example, ambient air). Thereafter, a heat treatment is conducted to fully cure the white paint for forming the reflective insulation layer 12.

Referring to FIG. 13C, a physical removal process is performed until the metal bumps 111, 112 are exposed. During the physical removal process, the reflective insulation layer 12 and the metal bumps 111, 112 are simultaneously removed, so the reflective insulation layer 12 and the metal bumps 111, 112 have bottom surfaces 121, 1112, 1122 substantially coplanar with each other. The bottom surfaces 121, 1112, 1122 becomes substantially flat. The related description can be referred to paragraphs directed to other embodiments. Finally, a dicing process is performed to form a plurality of the light-emitting devices 600.

Figure 14:
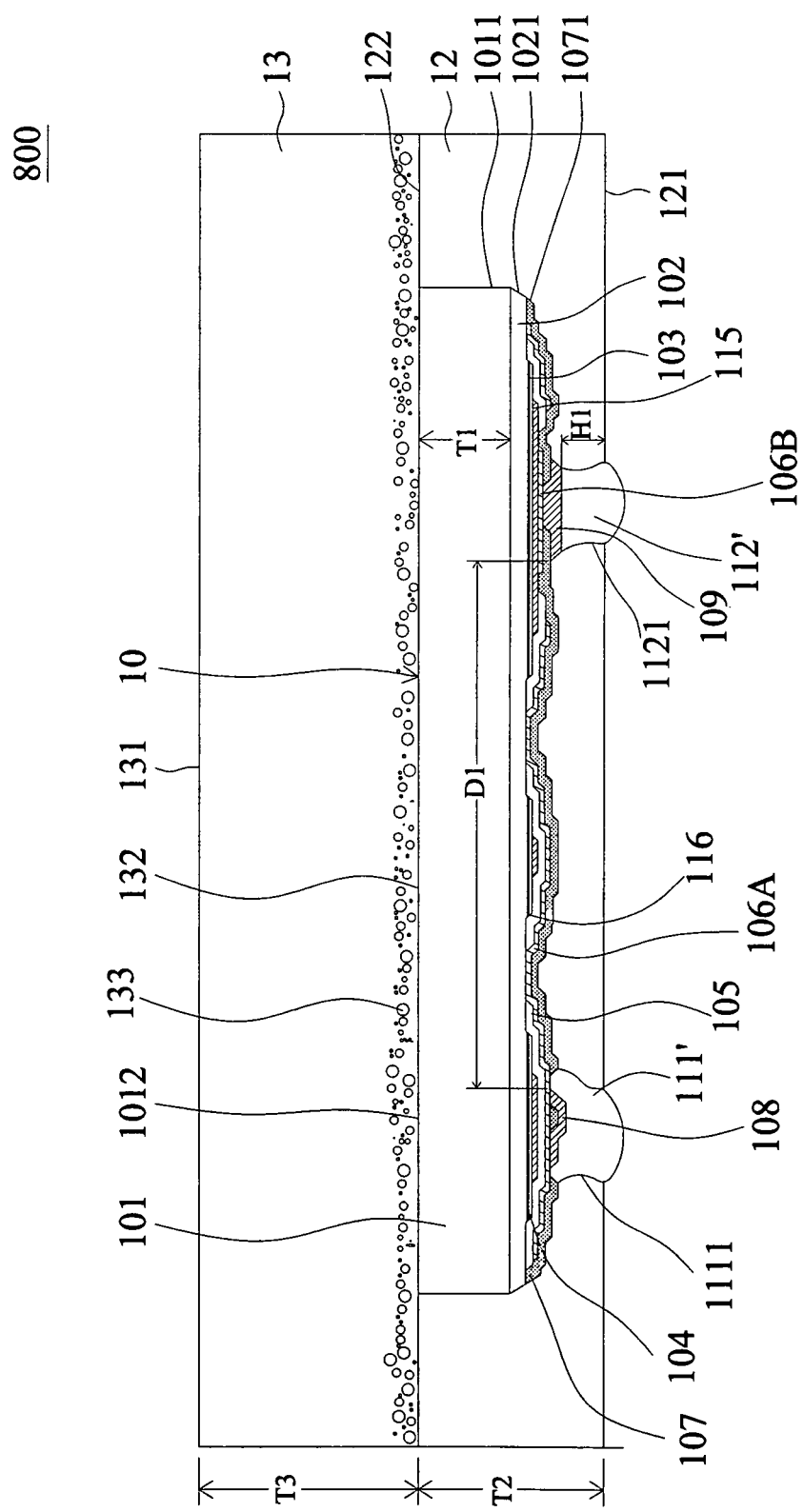
FIG. 14 is a cross-sectional view of a light-emitting device in accordance with an embodiment of the present disclosure.

FIG. 14 is a cross-sectional view of a light-emitting device 800 in accordance with an embodiment of the present disclosure. The light-emitting device 800 of FIG. 14 has a similar structure to that shown in FIG. 1C, and devices or elements with similar or the same symbols represent those with the same or similar functions. In one embodiment, the metal bumps 111', 112' can outwardly extend beyond or forming a bulge on the bottom surface 121 of the reflective insulation layer 12. In manufacturing process, an additional solder paste (a second solder paste) can be coated on the metal bumps 111, 112, which is formed by solidifying the first solder paste shown in FIG. 1C. Subsequently, a reflow process is conducted to solidify the additional solder paste to form the metal bumps 111' 112'. The second solder paste can have the material identical to or different from the first solder paste. If the material of the first solder paste is different from the second solder paste, the peak temperature of reflowing the second solder paste can be different from that of reflowing the first solder paste. For example, the peak temperature of reflowing the first solder paste is of 255° C. and the peak temperature of reflowing the first solder paste is of 265° C. in a reflow process. The first solder paste is a solder alloy of Sn—Ag—Cu and the second solder paste is a solder alloy of Sn—Sb. For the light-emitting device disclosed in other embodiment of the present disclosure, an additional solder paste can also be provided to form a bulge on the bottom surface of the reflective insulation layer. The bulge can be beneficial to connect the light-emitting device to its destination.

Figure 15:
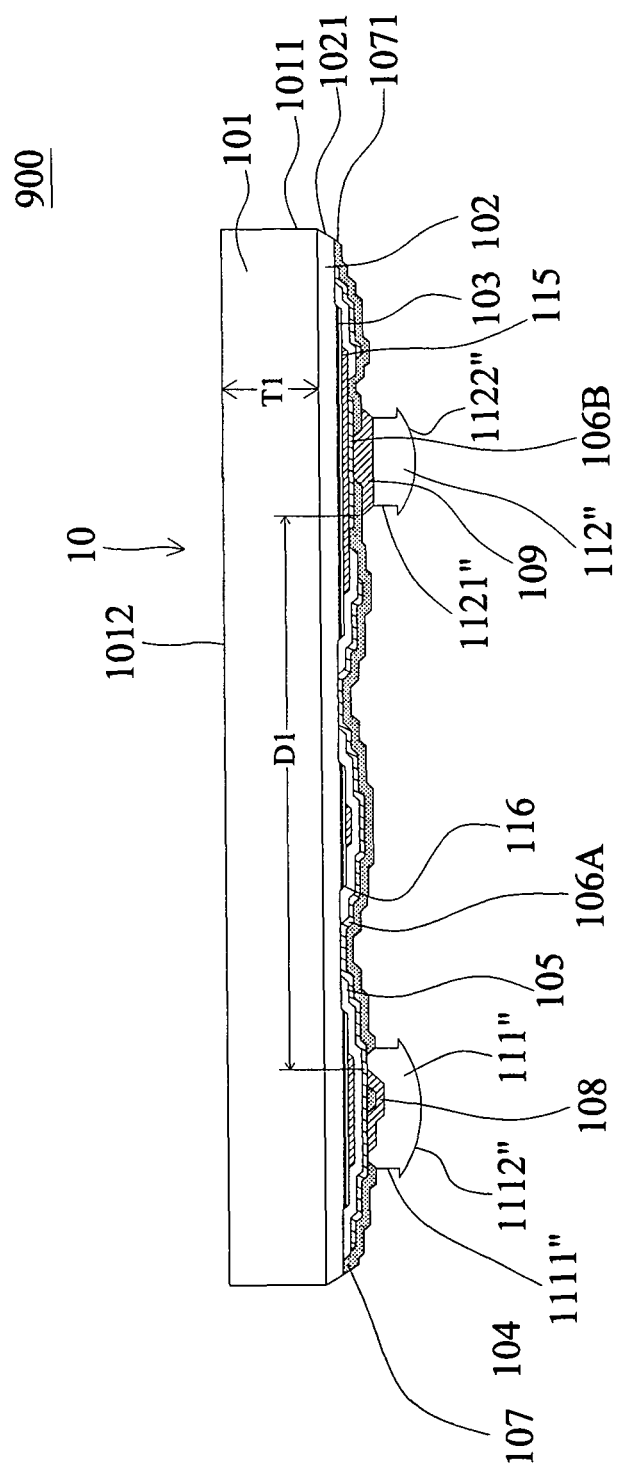
FIG. 15 is a cross-sectional view of a light-emitting device in accordance with an embodiment of the present disclosure.

FIG. 15 is a cross-sectional view of a light-emitting device 900 in accordance with an embodiment of the present disclosure. The light-emitting device 900 includes a light-emitting diode 10, a first metal bump 111", and a second metal bump 112". The detailed structure of the light-emitting diode 10 can be referred to descriptions directed to other embodiment. Each of the metal bumps 111", 112" has a vertical side surface 1111", 1121" substantially perpendicular to the top surface 1012 of the substrate 101 and a convex bottom surface 1112", 1122". The detailed description of the metal bumps 111", 112" will be discussed later.

Figure 16A:
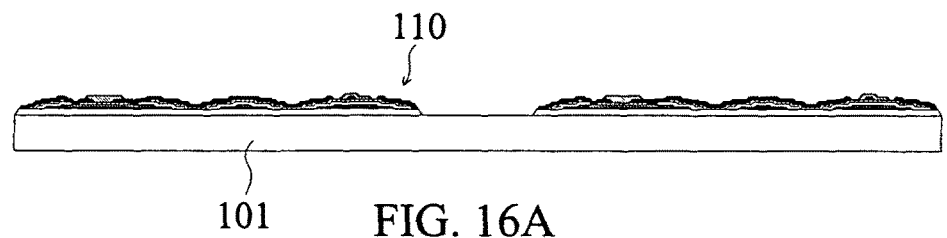
FIGS. 16A~16E are cross-sectional views of steps of making a light-emitting device in accordance with an embodiment of the present disclosure.

FIGS. 16A~16E are cross-sectional views of steps of making a light-emitting device 900 in accordance with one embodiment of the present disclosure. As shown in FIG. 16A, a plurality of separated light-emitting stacks 110 is epitaxially formed on a substrate 101.

Figure 16B:
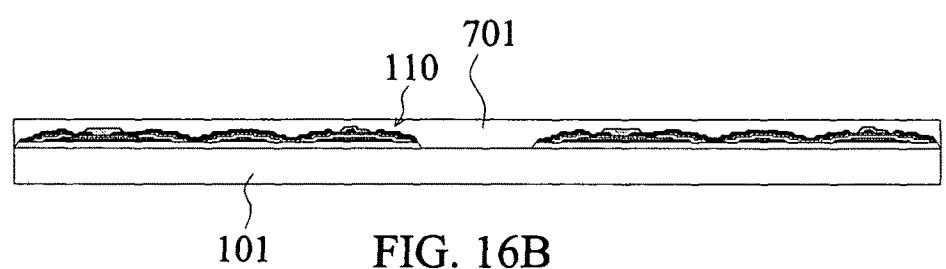

As shown in FIG. 16B, a photoresist 701 is formed on the insulation layer and has a height higher than the pads 108, 109.

Figure 16C:
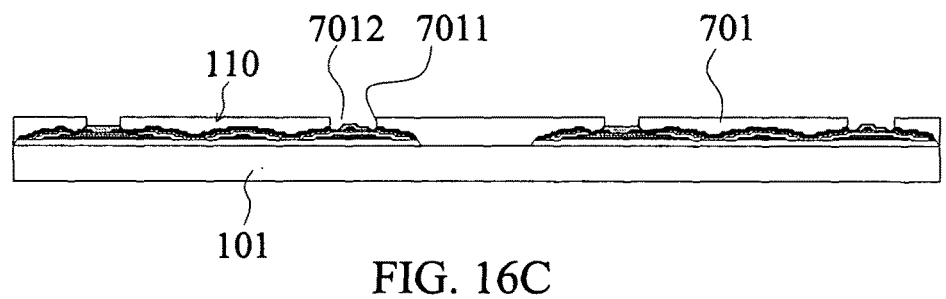

As shown in FIG. 16C, a photolithography is performed to remove the photoresist 701 on the pads 108, 109 to expose the pads 108, 109. In one embodiment, using dry etching to remove the photoresist 701 on the pads 108, 109, the photoresist 701 has a vertical sidewall 7011 for defining a rectangular space 7012 on the pads 108, 109.

Figure 16D:
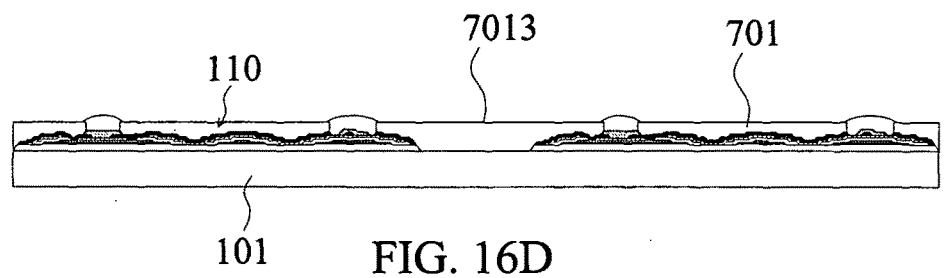

As shown in FIG. 16D, a solder paste is provided to fill up the rectangular space 7012 and cover a surface 7013 of the photoresist 701. Subsequently, a reflow process is conducted to form the metal bumps 111", 112".

Figure 16E:
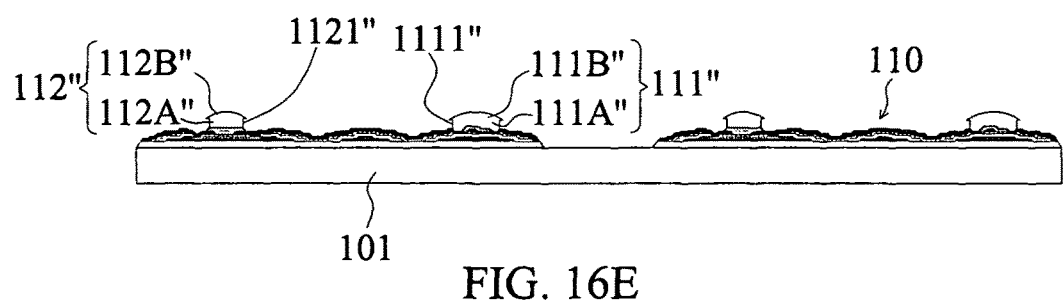

As shown in FIG. 16E, when the photoresist is removed by etching, each of the metal bumps 111", 112" has a first rectangular part 111"A, 112"A with a vertical side surface 1111", 1121" and a second part 111"B, 112"B with a mushroom head-like shape. A dicing process is performed to form a plurality of the light-emitting devices 600.

Figure 17A:
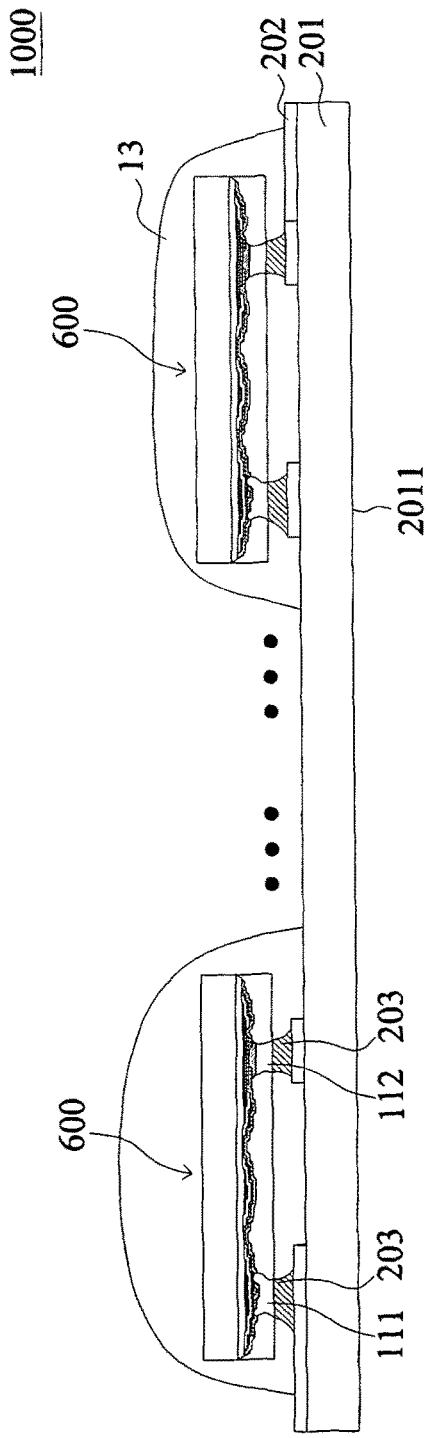
FIG. 17A is a cross-sectional view of a light-emitting element in accordance with an embodiment of the present disclosure.
Figure 17B:
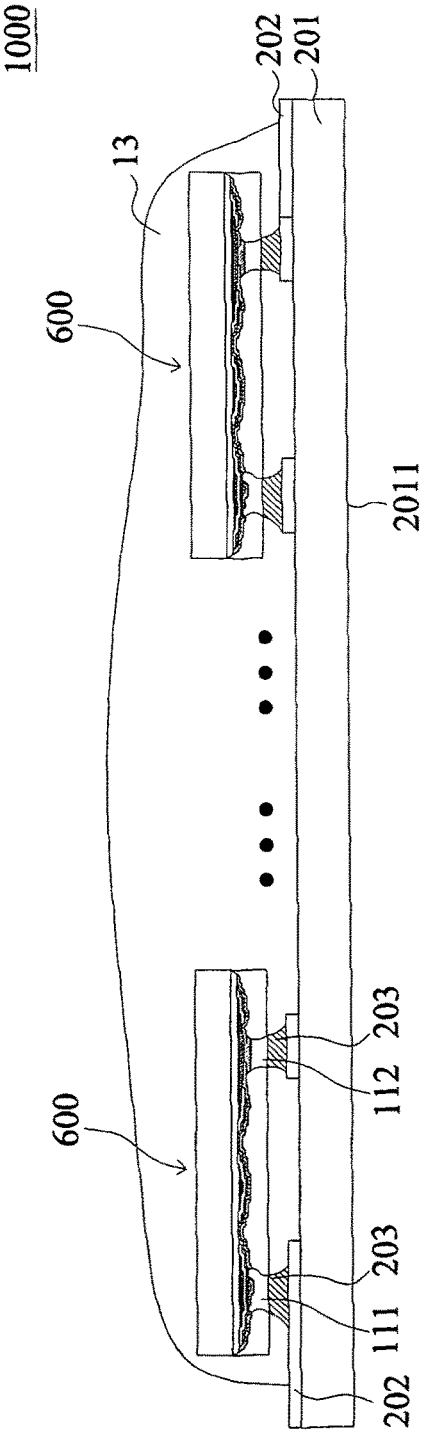
FIG. 17B is a cross-sectional view of a light-emitting element in accordance with an embodiment of the present disclosure.

FIG. 17A is a cross-sectional view of a light-emitting element 1000. The light-emitting element 1000 includes a carrier 201, a plurality of traces 202 formed on the carrier 201, a plurality of the light-emitting devices 600 mounted on the carrier 201 through a solder bump 203, and a wavelength conversion layer 13. In one embodiment, the wavelength conversion layer 13 has a plurality of parts, each of which covers a respective light-emitting device 600. In FIG. 17B, the wavelength conversion layer 13 covers all the light-emitting devices 600. The carrier 201 can be a transparent board (ex. glass, AlN, or Al$_2$O$_3$) and the traces 202 include silver paste or copper. Alternatively, the carrier 201 is a printed circuit board. When the carrier 201 is a transparent board, the wavelength conversion layer 13 can be further formed on the bottom surface 2011. The light-emitting device 600 is a surface mounted device (SMD) and can be bonded to the traces 202 through surface-mount technology (SMT). The light-emitting devices 600 can be electrically connected to each other in series or in parallel based on the configuration of the traces 202. In one embodiment, if the solder bump 203 has a material identical to the metal bump 111, 112, there is possibly no clear interface formed therebetween. Moreover, the solder bump 203 and the metal bump 111, 112 are an integrated piece while inspecting using by SEM.

In FIGS. 17A and 17B, the light-emitting device 600 is only illustrative, any one of the aforesaid light-emitting devices can be used in the light-emitting element 1000. In addition, when the light-emitting device includes the wavelength conversion layer 13, light-emitting element 1000 may not include the wavelength conversion layer 13.

Figure 17C:
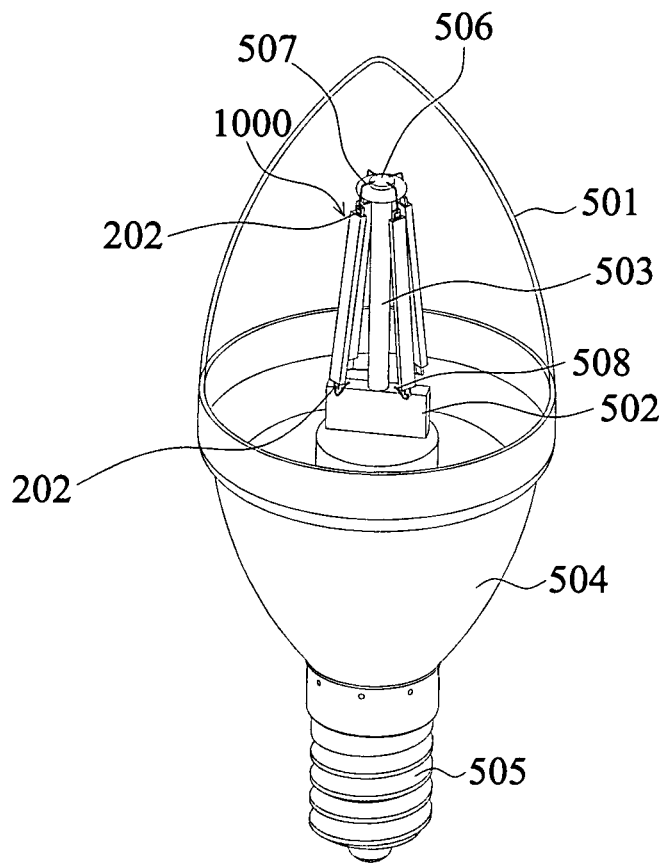
FIG. 17C is a perspective view of a light-emitting lamp in accordance with an embodiment of the present disclosure.

FIG. 17C is a perspective view of a light-emitting lamp 50. The light-emitting lamp 50 includes a transparent lamp cover 501, a driver 502, a support base 503, a plurality of light-emitting elements 1000, a heat sink 504, and an electrical base 505. The light-emitting elements 1000 are mounted on and electrically connected to the support base 903. Specifically, an electrical unit 506 is formed on a top surface of the support base 503 and electrically connected to the driver 502. Each of the light-emitting elements 1000 has a first end electrically connected to the electrical unit 506 through a metal wire 507 and a second end electrically connected to the driver 502 through another metal wire 508.

Figure 17D:
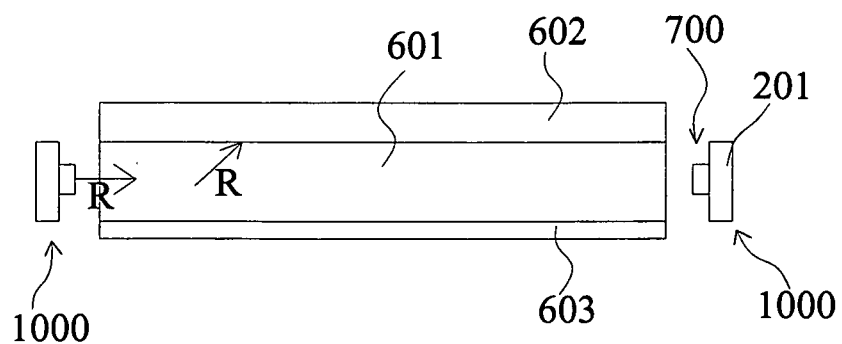
FIG. 17D is a cross-sectional view of a side view backlight module for a display in accordance with an embodiment of the present disclosure.

FIG. 17D is a cross-sectional view of a side view backlight module 60 for a display. The backlight module 60 includes the light-emitting element 1000, a light guide 601, a diffusor 602, and a reflective structure 603. The light-emitting element 1000 is arranged on one side of the light guide plate 601 and can emit light toward the light guide plate 601. The light in the light guide plate 601 will change its path toward the diffusor 602. The reflective structure 603 is configured to reflect the light toward the diffusor 602.

Figure 18:
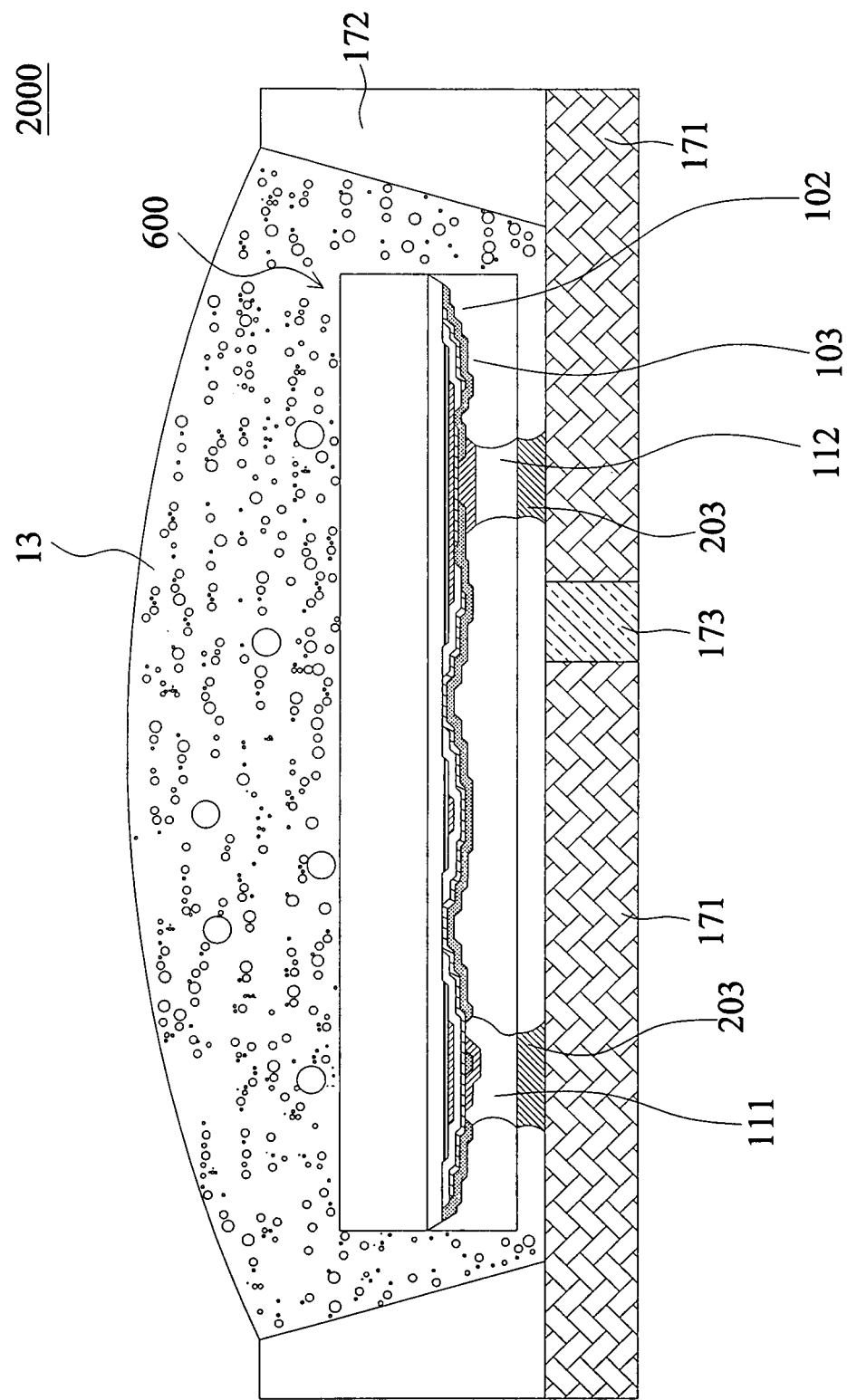
FIG. 18 is a cross-sectional view of a light-emitting package.

FIG. 18 shows a cross-sectional view of a light-emitting package 2000. The light-emitting package 2000 includes the light-emitting device 600, two spaced-apart conductive frames 171, and a reflector 172. The metal bumps 111, 112 are electrically connected to the two conductive frames 171 through a solder bump 203 by surface-mount technology (SMT). An insulator 173 is filled within the space between and to physically separate the two conductive frames 171. The wavelength conversion layer 13 covers the light-emitting device 600. The reflector 172 includes Epoxy Molding Compound (EMC) or Silicone Molding Compound (SMC). In a top view, the light-emitting package 2000 can have an area of 5.6 mm*3.0 mm, 3.0 mm*3.0 mm, 2.8 mm*3.5 m, 1.6 mm*1.6 mm, 1.0 mm*1.0 mm, 1.8 mm*0.3 mm and so on. Likewise, the light-emitting package 2000 is a surface mounted device (SMD) and can be bonded to the traces 202 on the carrier 201 (see FIG. 17A) through surface-mount technology (SMT) to form a light-emitting element.

In application, the aforesaid light-emitting device can be used to form a light engine applied in bulb, downlight, capsule lamp, or MR16. Alternatively, the aforesaid light-emitting device can be applied in a flash module for mobile phone or camera.

The temporary tape 191 (194, 196) includes blue tape, thermal release sheet or tape, UV release tape or polyethylene terephthalate (PET) for temporarily fixing the light-emitting diode or the light-emitting device during manufacturing. The electrical connection layer 106 can be made of metallic material, such as Au, Ag, Cu, Cr, Al, Pt, Ni, Ti, Sn or alloy thereof or a multilayer thereof.

The first insulation layer 105 can be a single layer or a multilayer structure. When the first insulating layer 105 is a single layer, it can be made of a material including oxide, nitride or polymer. The oxide can include $Al_2O_3$, $SiO_2$, $TiO_2$, $Ta_2O_5$, or $AlO_x$; the nitride can include AlN or $SiN_x$; the polymer can include polyimide or benzocyclobutane (BCB). When the first insulation layer 105 is a multilayer structure, the multilayer structure can be made of a stack of alternate layers, each of which is $Al_2O_3$, $SiO_2$, $TiO_2$, or $Nb_2O_5$ to form a Distributed Bragg Reflector (DBR) structure. The second insulation layer 107 can be made of a material referring to the first insulation layer 105.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a light-emitting diode comprising:
      an active layer;
      a pad electrically connected to the active layer and having a first side surface;
   a metal bump formed on the pad and having a second side surface; and
   a reflective insulation layer directly contacting the second side surface without covering the first side surface.

2. The light-emitting device of claim 1, further comprising a wavelength conversion layer formed on the reflective insulation layer and the light-emitting diode.

3. The light-emitting device of claim 2, wherein the wavelength conversion layer has a top surface and a bottom surface, and has a wavelength conversion particle concentration gradually decreasing from the top surface to the bottom surface.

4. The light-emitting device of claim 1, further comprising a plurality of scratched lines formed on the metal bump and exposed in a bottom view of the light-emitting device.

5. The light-emitting device of claim 1, wherein the light-emitting diode further comprises a semiconductor layer with a side surface covered by the reflective insulation layer.

6. The light-emitting device of claim 1, further comprising a wavelength conversion layer, wherein the light-emitting diode further comprises a substrate with a side surface covered by the wavelength conversion layer.

7. The light-emitting device of claim 1, further comprising a plurality of scratched lines formed on the reflective insulation layer.

8. The light-emitting device of claim 1, wherein the metal bump has a vertical side surface.

9. The light-emitting device of claim 1, wherein the metal bump is formed to outwardly extend beyond a surface of the reflective insulation layer.

10. The light-emitting device of claim 1, wherein the reflective insulation layer comprises a matrix with a refractive index of 1.5~1.6.

11. The light-emitting device of claim 2, wherein the wavelength conversion layer has a sidewall is substantially coplanar with the reflective insulation layer.

12. The light-emitting device of claim 1, wherein the first side surface is covered by the metal bump.

13. The light-emitting device of claim 1, further comprising a wavelength conversion layer, wherein the light-emitting diode further comprises an insulation layer formed on the active layer and having a side surface covered by the wavelength conversion layer.

14. The light-emitting device of claim 1, wherein the reflective insulation layer and the metal bump have bottom surfaces substantially coplanar with each other.

15. The light-emitting device of claim 1, further comprising a wavelength conversion layer, wherein the light-emitting diode further comprises a semiconductor layer with a side surface covered by the wavelength conversion layer.

16. The light-emitting device of claim 1, wherein the light-emitting diode further comprises an insulation layer on which the reflective insulation layer is formed.

17. The light-emitting device of claim 1, further comprising a wavelength conversion layer covering the light-emitting diode and having a side wall covered by the reflective insulation layer.

18. The light-emitting device of claim 17, wherein the wavelength conversion layer and the reflective insulation layer have top surfaces substantially coplanar with each other.

* * * * *